United States Patent
Yeh et al.

(10) Patent No.: US 7,132,350 B2
(45) Date of Patent: Nov. 7, 2006

(54) METHOD FOR MANUFACTURING A PROGRAMMABLE ERASELESS MEMORY

(75) Inventors: Chih Chieh Yeh, Taipei (TW); Han Chao Lai, Hsinchu (TW); Wen Jer Tsai, Hualian (TW); Tao Cheng Lu, Kaohsiung (TW); Chih Yuan Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/641,897

(22) Filed: Aug. 15, 2003

(65) Prior Publication Data

US 2005/0037546 A1 Feb. 17, 2005

Related U.S. Application Data

(60) Provisional application No. 60/560,707, filed on Jul. 21, 2003.

(51) Int. Cl.
*H01L 21/479* (2006.01)
*H01L 21/326* (2006.01)

(52) U.S. Cl. .................. 438/467; 438/131; 438/600

(58) Field of Classification Search ............... 438/131, 438/257, 467, 60, 957, 600; 365/225.7
See application file for complete search history.

(56) References Cited

U.S. PATENT DOCUMENTS

| | | | |
|---|---|---|---|
| 4,442,507 A | 4/1984 | Roesner | |
| 5,012,448 A | 4/1991 | Matsuoka et al. | |
| 5,057,451 A * | 10/1991 | McCollum | 438/448 |
| 5,093,711 A * | 3/1992 | Hirakawa | 257/754 |
| 5,335,138 A | 8/1994 | Sandhu et al. | |
| 5,350,710 A * | 9/1994 | Hong et al. | 438/467 |
| 5,457,650 A | 10/1995 | Sugiura et al. | |
| 5,471,418 A | 11/1995 | Tanigawa | |
| 5,536,968 A | 7/1996 | Crafts et al. | |
| 5,543,738 A | 8/1996 | Lee et al. | |
| 5,619,448 A | 4/1997 | Lin | |
| 5,668,752 A | 9/1997 | Hashimoto | |
| 5,721,701 A | 2/1998 | Ikebe et al. | |
| 5,729,490 A | 3/1998 | Calligaro et al. | |
| 5,813,664 A | 9/1998 | Pan | |
| 6,198,781 B1 | 3/2001 | Ohno et al. | |
| 6,432,782 B1 * | 8/2002 | Lung et al. | 438/300 |

(Continued)

OTHER PUBLICATIONS

C. de Graaf et al., "A Novel High-Density Low-Cost Diode Programmable Read Only Memory" Philips Research Labs., Prof. Holstlaan 4, 5656AA Eindhoven, The Netherlands, 1996 IEDM, pp. 189-192.

(Continued)

*Primary Examiner*—Zandra V. Smith
*Assistant Examiner*—Khanh Duong
(74) *Attorney, Agent, or Firm*—Haynes Beffel & Wolfeld LLP; Mark Haynes

(57) ABSTRACT

A method for manufacturing an electrically programmable non-volatile memory cell comprises forming a first electrode on a substrate, forming an inter-electrode layer of material on the first electrode having a property which is characterized by progressive change in response to stress, and forming a second electrode over the inter-electrode layer of material. The inter-electrode layer comprises a dielectric layer, such as ultra-thin oxide, between the first and second electrodes. A programmable resistance, or other property, is established by stressing the dielectric layer, representing stored data. Embodiments of the memory cell are adapted to store multiple bits of data per cell and/or adapted for programming more than one time without an erase process.

31 Claims, 22 Drawing Sheets

U.S. PATENT DOCUMENTS

| | | | |
|---|---|---|---|
| 6,490,218 B1* | 12/2002 | Vyvoda et al. | 365/225.7 |
| 6,534,841 B1* | 3/2003 | Van Brocklin et al. | 257/530 |
| 6,541,312 B1* | 4/2003 | Cleeves et al. | 438/131 |
| 6,555,844 B1* | 4/2003 | Lin et al. | 257/66 |
| 6,617,206 B1* | 9/2003 | Sandhu et al. | 438/240 |
| 6,618,295 B1* | 9/2003 | Scheuerlein | 365/189.09 |
| 6,650,143 B1 | 11/2003 | Peng | |
| 6,667,902 B1 | 12/2003 | Peng | |
| 6,671,040 B1 | 12/2003 | Fong et al. | |
| 6,677,220 B1* | 1/2004 | Van Brocklin et al. | 438/467 |
| 6,700,151 B1 | 3/2004 | Peng | |
| 6,703,652 B1* | 3/2004 | Van Brocklin et al. | 257/209 |
| 6,704,235 B1* | 3/2004 | Knall et al. | 365/225.7 |
| 6,713,839 B1* | 3/2004 | Madurawe | 257/530 |
| 2002/0074616 A1 | 6/2002 | Chen et al. | |
| 2002/0094611 A1 | 7/2002 | Wu et al. | |
| 2003/0080370 A1* | 5/2003 | Harari et al. | 257/314 |
| 2004/0008538 A1 | 1/2004 | Peng | |
| 2004/0031853 A1* | 2/2004 | Peng | 235/492 |
| 2004/0047218 A1 | 3/2004 | Peng | |
| 2004/0106251 A1 | 6/2004 | Forbes et al. | |
| 2004/0129995 A1 | 7/2004 | Yeo et al. | |
| 2004/0137688 A1 | 7/2004 | Chang et al. | |
| 2004/0217429 A1 | 11/2004 | Lin et al. | |
| 2004/0235203 A1 | 11/2004 | Gurba et al. | |
| 2004/0259341 A1 | 12/2004 | Chen et al. | |
| 2004/0266077 A1 | 12/2004 | Yeo et al. | |

OTHER PUBLICATIONS

M. Jelinek et al., "Hybrid PLD Technique for Nitrogen Rich CNx Layers", Lasers and Electro-Optics Europe, 2000. Conf. Digest. 2000 Conf. on, Sep. 10-15, 2000, 1 page.

B. Linder et al., "Growth and Scaling of Oxide Conduction After Breakdown", 41st Annual Int'l Reliability Physics Symposium, Dallas, TX, 2003, pp. 402-405.

S. Rossnagel et al., "From PVD to CVD to ALD for Interconnects and Related Applications", Interconnect Technology Conf., 2001. Proceedings of the IEEE 2001 Int'l, Jun. 4-6, 2001, pp. 3-5.

X.W Wang et al., "Ultra-Thin Silicon Nitride Films on Si by Jet Vapor Deposition", VLSI Technology, Systems and Applications, 1995, Proceedings of Technical Papers, 1995 International Symposium on, May 31-Jun. 2, 1995, pp. 49-52.

Takuji Hosoi et al. "A New Model of Time Evolution of Gate Leakage Current After Soft Breakdown in Ultra-Thin Gate Oxides" IEEE Feb. 2002 pp. 155-158.

Tahui Wang et al. "Negative Substrate Bias Enhanced Breakdown Hardness in Ultra-Thin Oxide pMOSFETs" IEEE 41st Annual International Reliability Physics Symposium, Dallas, Texas Aug. 2003 pp. 437-441.

Stathis, J.H., "Reliability limits for the gate insulator in CMOS technology," IBM. J. Res. & Dev., vol. 46, No. 2/3, Mar./May 2002, 265-286.

Miranda, Enrique, et al., "Analytic Modeling of Leakage Current Through Multiple Breakdown Paths in SiO2 Films," IEEE 39th Annual IRPS 2001, 367-379.

Wu, E.Y., et al., "Voltage-Dependent Voltage-Acceleration of Oxide Breakdown for Ultra-Thin Oxides," Electron Devices Meeting, 2000. IEDM Technical Digest. International, Dec. 10-13, 2000, 541-544.

Sune, Jordi et al., "Post Soft Breakdown Conduction in SiO2 Gate Oxides," Electron Devices Meeting, 2000. IEDM Technical Digest. International, Dec. 10-13, 2000, 533-536.

Rasras, Mahmoud, et al., "Substrate Hole Current Origin after Oxide Breakdown," Electron Devices Meeting, 2000. IEDM Technical Digest. International, Dec. 10-13, 2000, 537-540.

Lombardo, S., et al., "Softening of breakdown in ultra-thin gate oxide nMOSFETs at low inversion layer density," Reliability Physics Symposium, 2001. Proceedings. 39th Annual. 2001 IEEE International, Apr. 30-May 3, 2001, 163-167.

Monsieur, F., et al., "A Thorough Investigation of Progressive Breakdown in Ultra-thin Oxides. Physical Understanding and Application for Industrial Reliability Assessment," Reliability Physics Symposium Proceedings, 2002. 40th Annual, Apr. 7-11, 2002, 45-54.

Suehle, J., "Ultra-Thin GAte Oxide Reliability and Implications for Qualification, Design, and Use in Ionizing Radiation Environments," NASA Microelectronics Reliability and Qualification Workshop, Manhattan Beach Marriott, Manhattan Beach, CA Dec. 3, 2002, 30 pages.

Neaman, Donald A., "The Two-Terminal MOS Structure," Semiconductor Physics & Devices, p. 421.

* cited by examiner

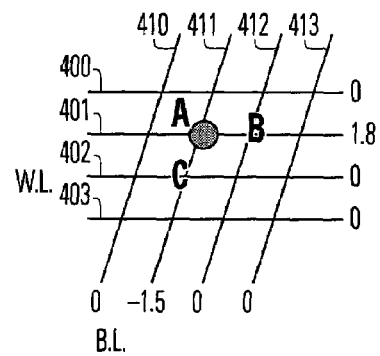
FIG. 27A
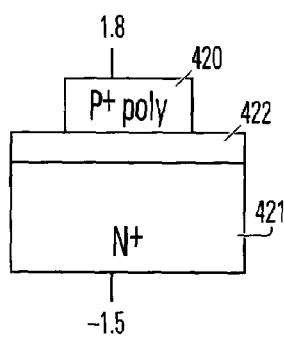 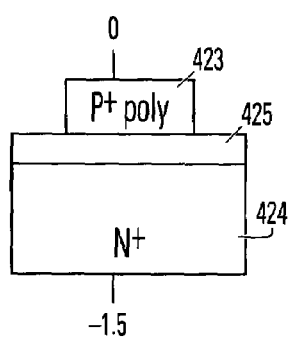 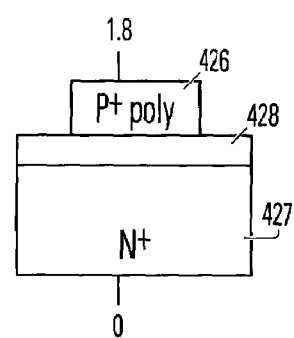
FIG. 27B  FIG. 27C  FIG. 27D

Selected Programmed Cell

Selected Unprogrammed Cell

Unselected Programmed Cell

METHOD FOR MANUFACTURING A PROGRAMMABLE ERASELESS MEMORY

REFERENCE TO RELATED APPLICATION

The present application claims the benefit of Provisional U.S. Patent Application No. 60/560,707, entitled PROGRAMMABLE RESISTOR ERASELESS MEMORY, invented by Yeh, et al., and filed on 21 Jul. 2003. (converted application Ser. No. 10/624,919 from non-provisional status to provisional status)

The present application is related to U.S. patent application Ser. No. 10/642,249, entitled METHOD FOR PROGRAMMING PROGRAMMABLE ERASELESS MEMORY, invented by Yeh, et al., and filed on the same day as the present application.

The present application is related to U.S. patent application Ser. No. 10/641,846, entitled PROGRAMMABLE ERASELESS MEMORY, invented by Yeh, et al., and filed on the same day as the present application.

BACKGROUND OF THE INVENTION

1. Field of the Invention

The present invention relates to electrically programmable, non-volatile memory and integrated circuits including such memory, and more particularly to a memory cell structure and method of operation based upon programmable resistance induced by progressive breakdown of ultra-thin dielectric layers and related structures.

2. Description of Related Art

Electrically programmable non-volatile memory technologies are being adapted to many applications. The various technologies vary in the number of times that the memory cells can be programmed, the voltages required to achieve programming, and the number of bits of data stored in each memory cell. Also, an important consideration in determining whether to apply a particular memory technology is the manufacturing steps required to form the memory cells and supporting circuitry.

Memory technologies based upon floating gates like standard EEPROM, or charge trapping layers like oxide-nitride-oxide memory cells, are typically programmable many times. However, these technologies require complex programming and erasing circuitry, and employ complex charge pump techniques to achieve the voltages required for programming and erasing. Also, when storing more than one bit of data per memory cell, complex programming and sensing technologies are required. Finally, with respect to these types of flash memory, manufacturing steps needed to form the memory cells often include expensive steps not normally required for forming standard logic circuitry, such as CMOS logic, on the same integrated circuit.

A simple electrically programmable memory cell structure has been described by de Graaf, et al., "A Novel High-Density Low-Cost Diode Programmable Read-only Memory," IEDM 1996, pages 7.6.1–7.6.4. According to de Graaf, et al., a one-time programmable high-density memory can be achieved using a diode-antifuse structure that consists of a first n-type polysilicon electrode, a second p-type diffusion electrode, and a layer of dielectric such as about 60 Angstroms of thermally grown silicon dioxide between the electrodes. In this structure, the memory cells are programmed by applying high-voltage, around 13 volts, to induce breakdown of the dielectric layer, and thereby forming a physical connection between electrodes of programmed cells. Although the de Graaf, et al., structure is compact and easy to manufacture, it allows only one-time programming, and requires high-voltage operation.

It is desirable to provide electrically programmable non-volatile memory cell technologies that can be operated at low voltages, and can be made using processes more compatible with standard CMOS logic manufacturing techniques. Also, is desirable that such non-volatile memory cell technologies provide for programming multiple times, and/or storing more than one bit per memory cell.

SUMMARY OF THE INVENTION

The present invention provides an electrically programmable, non-volatile memory cell, and methods for manufacturing the cell, that comprises a first electrode, a second electrode and a layer between the first and second electrodes which is characterized by substantially progressive change of a measurable property, such as resistance, reactance, magnetization, polarization, and arrangement of elements of the layer, by progressive amounts of stress by which a programmable property is established representing stored data. The layer comprises an ultra-thin layer of material, where ultra-thin can be defined as so thin that a property of thicker layers of the material which is essentially stable in normal operating conditions can be changed in controllable amounts, as described herein. In an embodiment of the invention, the layer comprises a material which is a dielectric at typical thicknesses, and the memory cell is characterized by progressive change of resistance caused by progressive amounts of stress created by application of low voltages across the dielectric layer for intervals of time, by which a programmable resistance is established representing stored data. The repeatable programming on a given cell does not require an "erase operation" to provide a multiple time programmable memory. Rather the multiple levels of resistance can be used to establish multiple program states in a single physical memory cell, which can correspond to multiple bits of data, or which can correspond to multiple program cycles. Such a memory cell can be called a programmable resistance eraseless memory (PREM) cell.

In embodiments of the present invention, the memory cell can be adapted to store multiple bits of data per cell; can be adapted for programming more than one time without an erase process; and can be adapted both to store multiple bits of data per cell and for programming more than one time without an erase process. In addition, analog data may be stored in the memory cell.

Progressive breakdown of ultra-thin oxides has been described in the literature in connection with a limit on the scalability of dielectric layers used in transistor gates. See, Hosoi, et al., "A New Model of Time Evolution of Gate Leakage Current after Soft Breakdown in Ultra-Thin Gate Oxides," IEDM, 2002; Wang, et al., "Negative Substrate Bias Enhanced Breakdown Hardness in Ultra-Thin Oxide pMOSFETs," 41st Annual International Reliability Physics Symposium, Dallas, Tex. 2003; and Linder, et al., "Growth and Scaling of Oxide Conduction after Breakdown," 41st Annual International Reliability Physics Symposium, Dallas, Tex. 2003.

The progressive breakdown phenomenon is referred to as "soft breakdown" in the Hosoi, et al., article, and as breakdown evolution "in a progressive way," in the Wang, et al. article. The progressive breakdown characteristic of ultra-thin oxide has been characterized by a "degradation rate" which depends on stress voltage, oxide thickness, substrate doping, area and channel length in the Linder, et al., article. According to the present invention, the progressive breakdown phenomenon is applied to establish programmable resistance values in simple memory cell structures. Resulting structures are compact, can be manufactured easily with standard CMOS processes, and can be operated at low voltages.

Accordingly, embodiments of the present invention provide a memory cell including a first electrode, a second electrode, and a layer between the first and second electrodes. The layer is characterized by progressive breakdown in response to stress induced, for example, by voltage across the layer. Embodiments of the invention are operable with progressive changes in a property generated in response to stress voltage across the layer of less than about five volts. In some embodiments the programming stress is induced by applying a positive voltage to the first electrode, while applying a negative voltage to the second electrode, wherein the absolute value of the positive and negative voltages respectively is less than two volts.

A method for manufacturing a memory cell according to the present invention comprises forming the first electrode on a substrate, forming an inter-electrode layer of material on the first electrode having a property which is characterized by progressive change in response to stress, and forming a second electrode over the inter-electrode layer of material. The first electrode can be formed by providing a semiconductor substrate, and implanting n- or p-type dopants to form a conductive region in the substrate. Alternatively, the first electrode can be formed by growing or depositing one or more layers of conductive material on the substrate. Likewise, the inter-electrode layer of material is formed by growing or depositing the material on the first electrode. In one example, the inter-electrode layer of material comprises silicon dioxide, or silicon oxynitride, formed by thermal growth on an electrode formed by doping a silicon substrate. The second electrode is formed in other embodiments of this invention by growing or depositing one or more layers of conductive material on the inter-electrode layer.

A memory array can be manufactured according to the present invention according to the following steps:
forming a first plurality of conductive lines on said substrate, said first plurality of conductive lines extending generally in parallel in a first direction;
forming a second plurality of conductive lines over said first plurality of conductive lines, said second plurality of conductive lines extending generally in parallel in a second direction orthogonal to the first direction defining an array of intersections; and
forming an inter-electrode layer of material at said intersections between said first plurality of conductive lines and said second plurality of conductive lines, said inter-electrode layer of material characterized by progressive change in a property in response to stress, to form memory cells at said intersections; and
providing circuitry on said substrate for applying said stress and sensing said property in said memory cells.

In some embodiments of the invention, a plurality of trenches filled with dielectric is formed between the lines in the first plurality of conductive lines, using STI or LOCOS isolation processes for example. This forms isolation structures between the columns of memory cells. The plurality of trenches can be formed before forming the first plurality of conductive lines. The first plurality of conductive lines is then formed in the regions between the trenches, such as by doping the semiconductor substrate. In other embodiments, the plurality of trenches can be formed after depositing or forming a layer of the material used for the first plurality of conductive lines. In this case, the act of forming the plurality of trenches divides the layer into the plurality of conductive lines.

In one embodiment of the invention, a memory cell is formed according to the following steps:
implanting dopant in said silicon substrate to form a conductive diffusion region having a first conductivity type;
forming a layer of silicon oxide on the conductive diffusion region, the layer of silicon oxide having thickness of less than 15 Angstroms; and
forming a layer of doped polysilicon having a second conductivity type over said layer of silicon oxide.

The processes used for forming the first and second conductive lines, and the inter-electrode material can be varied according to the particular choices of materials, and thicknesses of materials utilized.

Ultra-thin layers utilized according to the present invention comprise silicon oxides, such as silicon oxynitrides, and doped and undoped silicon dioxides, having a thickness of less than 20 Angstroms between the first and second electrodes, and in other embodiments having a thickness of less than 15 Angstroms between the first and second electrodes. A lower limit on the thickness of silicon oxides, or other materials, characterized by progressive changes in a property suitable for use as a memory device is based on the ability to program and sense amounts of progressive changes in the property. Representative other materials used as the ultra-thin layer according to the present invention include silicon nitrides, multilayer stacks such as oxide-nitride-oxide ONO stacks, and aluminum oxides. Dielectric materials like $Al_2O_3$, $YTa_2O_5$, $HfO_2$, $Y_2O_3$, $CeO_2$, $TiO_2$, $HfSi_xO_y$, HfSiON, $HfAlO_x$, $TaO_xN_y$, $ZrO_2$, $ZrSi_xO_y$, $La_2O_3$, $ZrO_2$, etc. may also be used as film 11 in embodiments of the memory cell.

The composition of the first and second electrodes can vary according to the environment in which the invention is applied. According to embodiments of the invention, the first electrode comprises a layer of polysilicon, and the second electrode comprises the conductive diffusion region in a semiconductor substrate. In yet other embodiments, the layer of polysilicon and the conductive diffusion regions have opposite conductivity types, resulting in a diode-like programmable resistance memory cell. In yet other embodiments, the first and second electrodes maybe comprised of combinations of conductors, including metals like copper, aluminum, tungsten and titanium and alloys and combinations thereof, p-type and n-type polysilicon, p-type and n-type diffusion regions, metal silicides, semi-metals, and the like. In some embodiments, the electrodes comprise an elemental material and the inter-electrode layer of material in between the electrodes comprises a compound including the same elemental material. For example, the first and second electrodes comprise a material including silicon, like amorphous silicon, single crystal silicon, polysilicon, metal silicide, and the like, and the inter-electrode layer of material in between the first and second electrodes comprises a compound, like a silicon oxide or a silicon nitride, also comprising silicon.

The present invention also provides an integrated circuit that comprises an array of memory cells implemented as described above, along with logic to program the memory cells by causing said progressive breakdown of the dielectric layer, and sense circuitry to sense an amount of progressive breakdown in the memory cells in the array. The amount of progressive breakdown is indicated in embodiments of the present invention by changes in resistance in the memory cell. Multiple levels of the property changed can be programmed and sensed to establish multiple bits per memory cell. For example, the program logic in one embodiment operates by stressing a selected memory cell, then verifying whether the stress resulted in an expected amount of progressive change. If the verify operation fails, then the stress and verify operations are retried, and the procedure is repeated until the memory cell is successfully programmed or a retry is limit is reached.

The sense circuitry according to embodiments of the invention comprises a reference current source and circuitry to compare current from the memory cell with the reference current source. In embodiments adapted for sensing multiple bits per cell, or multiple levels of progressive change of a property, the sense circuitry may comprise a plurality of reference current sources, and circuitry to compare current from the memory cell with one or more reference currents from the plurality of reference current sources.

The present invention is also embodied by a method for programming a memory cell, including programming based on applying stress to the inter-electrode layer to induce a progressive change in a property of the layer. Because of the progressive nature of the change, many levels of programming can be achieved. The many levels of programming can be applied for programming a single cell more than once, without an erase process, to programming multiple bits in a single cell, and to a combination of multiple bit and multiple time of programming.

According to some embodiments of the invention, the procedure for applying stress to memory cell during programming includes applying a sequence of pulses and verify steps, such as can be generally described as follows:

applying a first program pulse to the cell having a first pulse height and a first pulse width;
determining whether the cell is programmed in response to the first program pulse; and if not
applying a program retry pulse to the cell;
determining whether the cell is programmed in response to the program retry pulse; and if not
iteratively applying another program retry pulse to the cell and determining whether the cell is programmed, until the cell is determined to be programmed or a maximum number of retries is made;
wherein the program retry pulses have respective pulse widths and pulse heights which vary according to a pattern in which at least one program retry pulse has a different pulse width or different pulse height than other program retry pulses in the pattern.

In embodiments of the invention, the method for programming includes a verify step. The verify step includes generating a signal, such as a reference current, which indicates the value of the property in the selected memory cell. Then, the signal is compared with a reference signal to verify programming of the desired data.

In embodiments where a single cell is programmed multiple times, the programming method includes maintaining a record of the number of program cycles applied to the memory array, such as using a state machine or other data storage or logic structures. The reference signal used during a verify step, or for sensing the data in the memory cells, is selected based on the number of program cycles which have been executed, from a source of a plurality of reference signals which respectively correspond with a plurality of program cycles.

The present invention allows for resetting data stored in memory array, where data in the memory array is stored by setting a property of memory cells in the array above or below a reference level to indicate a data value, by simply changing the reference level. The term "reset" in this context means to set all cells to a common value, usually "0" for a one bit cell, or "00" for a two bit cell, and so on. This approach to reset enables programming the array multiple times to store one or more bits per cell. The process according to this embodiment of the invention involves first resetting the memory array by changing the reference level for a single bit cell, or the set of reference levels for a multiple bit cell, so that all memory cells in the array have the sensed property lying at a level that is one of above and below the new reference level, or set of reference levels. After resetting by changing the reference, the array can be re-programmed by applying stress to selected cells as described above, using the new reference or set of references. Accordingly, a reset is executed without an "erase" operation designed to change the property of the memory cells being sensed by applying stress to the memory cells. In this sense, the method of programming according to the present invention can be characterized as "eraseless."

In embodiments where multiple bits are stored in a single cell, the programming method includes providing a value for the multiple bits of data to be programmed in the memory cell. The reference signal used during a verify step, or for sensing the multiple bits of data in the memory cell, is selected from a plurality of reference signals which correspond with a corresponding plurality of values for the multiple bits of data.

The present invention is also embodied by an integrated circuit comprising logic, such as a general-purpose processor or special-purpose logic, high-speed memory such as static random access memory, and a PREM memory array as described above based upon programmable resistance induced by progressive breakdown of the dielectric layer. In some embodiments, the logic to program the memory array comprises instructions executed by an on-chip general-purpose processor.

Other aspects and advantages of the present invention can be seen on review of the drawings, the detailed description and the claims, which follow.

BRIEF DESCRIPTION OF THE DRAWINGS

FIGS. 27A–27D illustrate programming and program disturb conditions for a memory array according to the present invention.

DETAILED DESCRIPTION

A detailed description of embodiments of the present invention is provided with reference to FIGS. 1–36.

Figure 1:
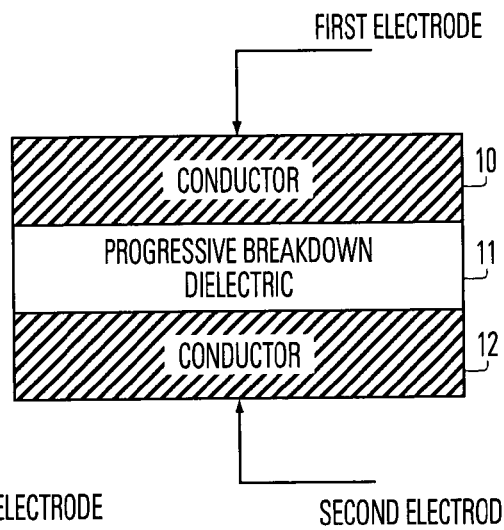
FIG. 1 is a simplified diagram of a programmable resistance memory cell including a progressive breakdown dielectric film according to the present invention.
Figure 2:
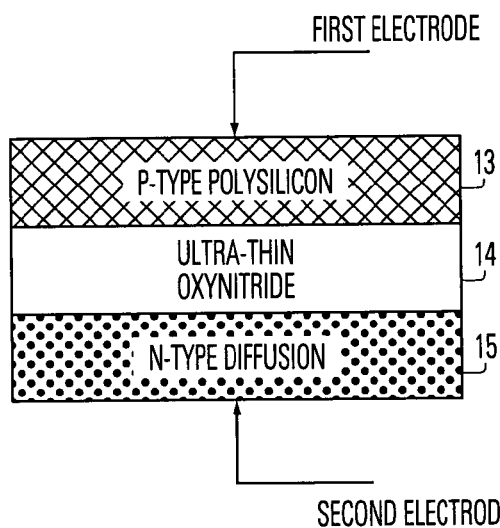
FIG. 2 is a simplified diagram of a diode-like programmable resistance memory cell including a progressive breakdown dielectric film, based on ultra-thin oxynitride, with a first electrode comprising p-type polysilicon and a second electrode comprising n-type diffusion in a semiconductor substrate.
Figure 3:
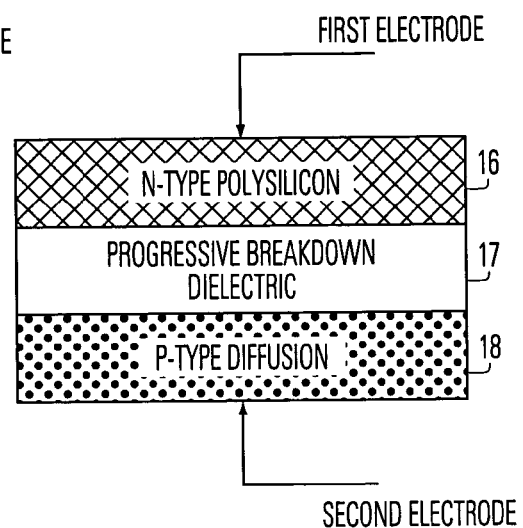
FIG. 3 is a simplified diagram of a diode-like programmable resistance memory cell including a progressive breakdown dielectric film with a first electrode comprising n-type polysilicon and a second electrode comprising p-type diffusion in a semiconductor substrate.

FIGS. 1–3 illustrate basic memory cell structures according to the present invention. As shown in FIG. 1, a memory cell comprises a conductor 10, a progressive breakdown dielectric film 11, and a conductor 12. The conductor 10 acts as a first electrode. The conductor 12 acts as a second electrode. The dielectric film 11 comprises a material having a thickness or other structural feature, characterized by a property subject to progressive change in response to stress. Representative dielectrics which exhibit the progressive breakdown characteristic causing progressive change in resistance, include ultra-thin oxides, such as oxynitride having a thickness of less than 20 Angstroms, and more preferably about 15 Angstroms or less.

One way in which oxynitride can be formed comprises using standard thermal silicon dioxide growth processes, along with or followed by nitridation by exposure to NO or $N_2O$, in a step which may be shared with oxide growth for peripheral devices outside the memory array. Other silicon dioxides with and without nitridation can be used. The dielectric film 11 can also include oxides and other materials formed by chemical vapor deposition CVD, by plasma enhanced chemical vapor deposition PECVD, by TEOS CVD, by high-density plasma chemical vapor deposition HPCVD, and other processes can be used. Materials used for the dielectric film 11 may be formed by applying sputtering, pulsed vapor deposition PVD, jet vapor deposition JVD, and atomic layer deposition ALD oxide. For background information about various possible deposition technologies, see, Rossnagel, S. M.; et al.; "From PVD to CVD to ALD for interconnects and related applications," Interconnect Technology Conference, 2001. Proceedings of the IEEE 2001 International, 4–6 Jun. 2001 Page(s): 3–5; Jelinek, M.; et al.; "Hybrid PLD technique for nitrogen rich CN, layers," Lasers and Electro-Optics Europe, 2000, Conference Digest 2000, Conference on 10–15 Sep. 2000, Page(s): 1 pp.; and Wang, X, W.; et al.; "Ultra-thin silicon nitride films on Si by jet vapor deposition," VLSI Technology, Systems, and Applications, 1995. Proceedings of Technical Papers., 1995 International Symposium on, 3 1 May-2 Jun. 1995, Page(s): 49–52.

Furthermore, other dielectric materials exhibiting progressive breakdown can be utilized, such as multilayer dielectrics like oxide-nitride-oxide ONO, or aluminum oxide. Materials like $Al_2O_3$, $YTa_2O_5$, $HfO_2$, $Y_2O_3$, $CeO_2$, $TiO_2$, $HfSi_xO_y$, HfSiON, $HfAlO_x$, $TaO_xN_y$, $ZrO_2$, $ZrSi_xO_y$, $La_2O_3$, $ZrO_2$, etc. may also be used as film 11 in embodiments of the memory cell.

The conductors 10 and 12 comprise conductive material, including but not limited to metal, semi-metal and conductively doped semiconductor. The conductors 10 and 12 need not be formed of the same material, but rather may be formed using materials that are readily provided for in the manufacturing process. Thus, the conductors 10 and 12 can be formed using doped semiconductors like p-type and n-type polysilicon, doped GaAs, etc.; using metals like aluminum, copper, tungsten, titanium, tantalum, etc.; using semi-metals like TiW, TiN, etc., and using metal silicides like $WSi_x$, and $TSi_x$.

FIG. 2 illustrates one preferred embodiment, comprising a first electrode 13 made of p-type polysilicon, a progressive breakdown dielectric film 14 made of 15 Angstroms of oxynitride, and a second electrode 15 made of an n-type diffusion region in a semiconductor substrate. FIG. 3 illustrates another preferred embodiment, comprising a first electrode 16 made of n-type polysilicon, a progressive breakdown dielectric film 17, and a second electrode 18 made of an p-type diffusion region in a semiconductor substrate. The impurity type used in the conductors (p-type or n-type) forming the first and second electrode can be the same type or different type—the choice is up to process convenience or various device design considerations.

Figure 4:
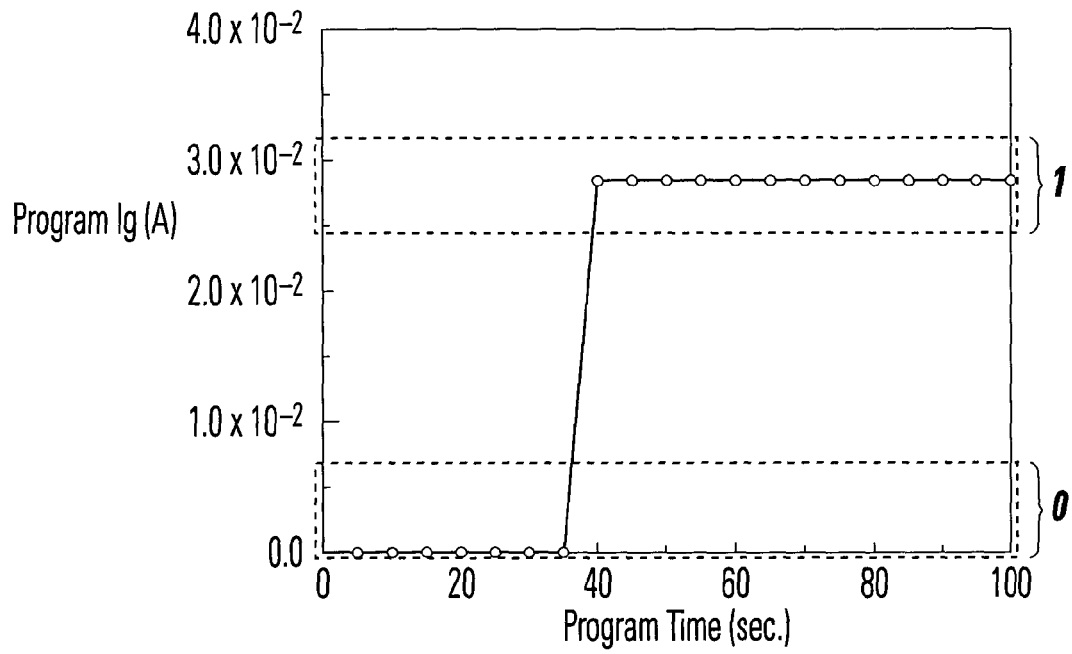
FIG. 4 illustrates the catastrophic breakdown behavior of a prior art dielectric film, as described in de Graaf, et al. mentioned above.

FIG. 4 shows hard breakdown characteristics of a 25 Angstrom thick oxynitride layer, such as might be employed in the prior art memory cell of de Graaf et al. mentioned above. As can be seen, after a stress time interval of about 35 seconds the program current jumps abruptly from near 0 to about 30 milliamps, signaling a hard breakdown of the dielectric layer.

Figure 5:
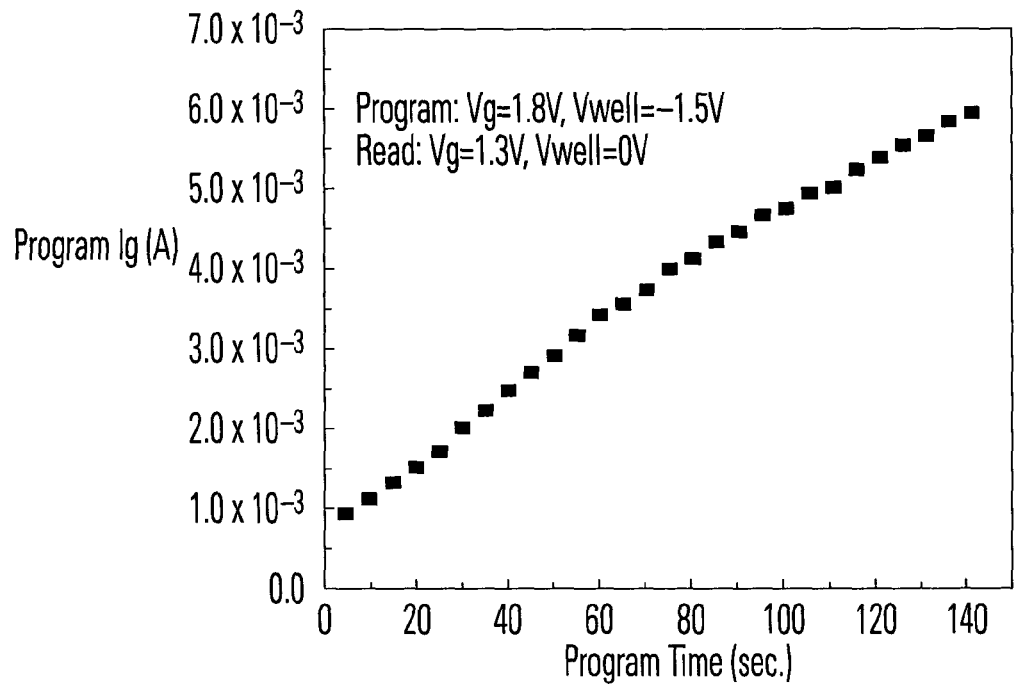
FIG. 5 is a graph showing program current versus program time for a progressive breakdown memory cell such as shown in FIG. 2.

According to the present invention, as shown in FIG. 5, by employing a dielectric layer demonstrating progressive breakdown a more gradual increase in program current is observed over programming time. Thus, for a 15 Angstrom oxynitride film, with a p-type polysilicon top electrode and a n-type buried diffusion bottom electrode, program current increases from about one milliamp to about 6 milliamps in a nearly linear fashion from about five seconds of stress time to about 140 seconds of stress time, where the stress applied for programming is about 1.8 volts on the top electrode, and about −1.5 volts on the bottom electrode. A diode-like memory cell programmed in this way is adapted for a read voltage of about 1.3 volts, for example, on the top electrode and zero volts on the bottom electrode.

Figure 6:
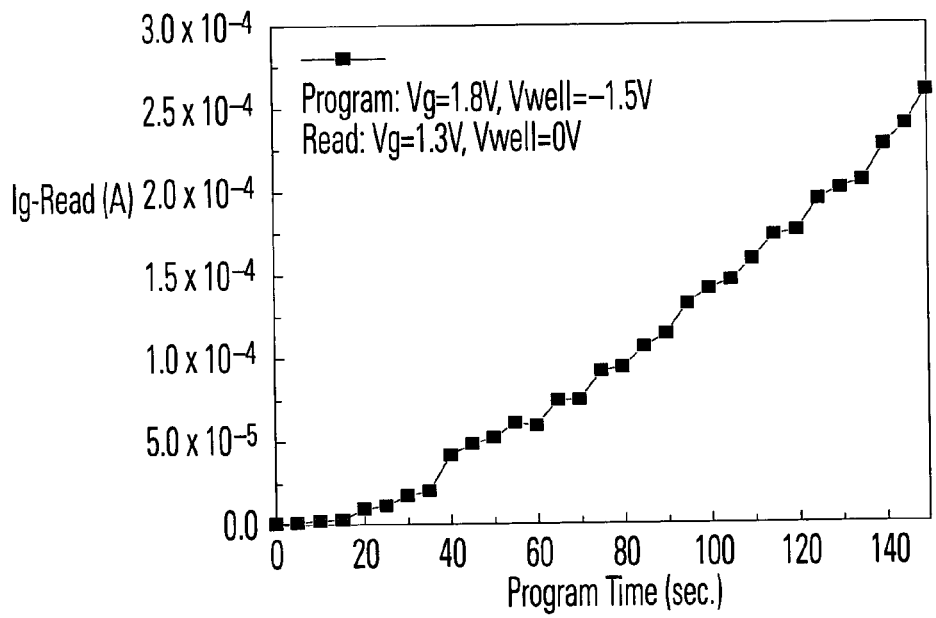
FIG. 6 is a graph showing read current versus program time for a progressive breakdown memory cell such as shown in FIG. 2.

FIG. 6 shows read currents observed for the representative read voltage of 1.3 volts on the top electrode and zero volts on the bottom electrode, for increasing program time under program stress of about 1.8 volts on the top electrode and about −1.5 volts on the bottom electrode. It can be seen that read current increases in a substantially progressive, and nearly linear fashion from less than about one microamp after 15 seconds low voltage program stress to about 0.25 milliamps after about 150 seconds of low voltage program stress.

Figure 6A:
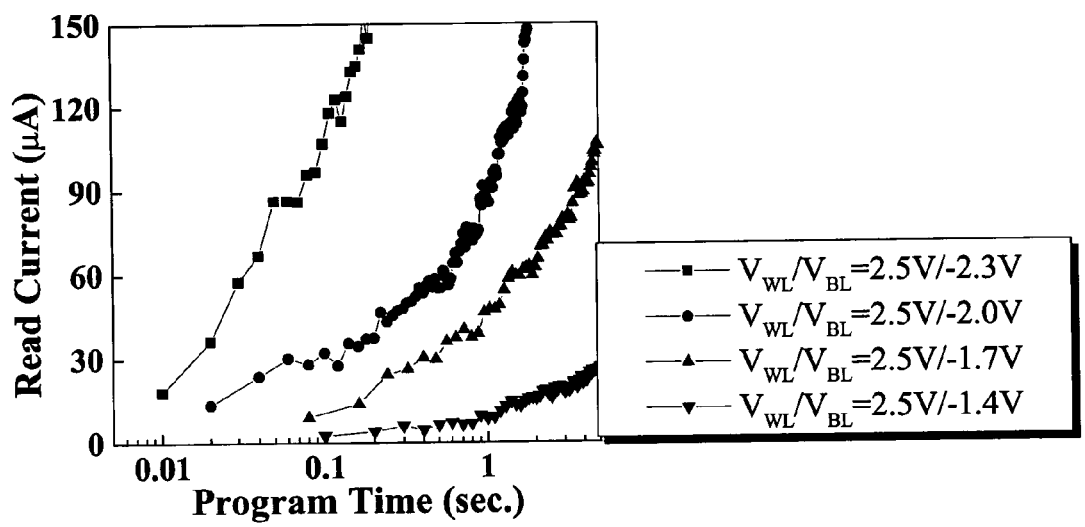
FIG. 6A is a graph showing read current versus program time for a progressive breakdown memory cell such as shown in FIG. 2, with four different magnitudes of program stress voltage.

FIG. 6A shows read currents observed for the representative read voltage of 1.3 volts on the top electrode and zero volts on the bottom electrode, for increasing program time, for four values of program stress. The first trace corresponds with a wordline (top electrode) voltage of about 2.5 volts and a bit line (bottom electrode) voltage of about −2.3 volts. The second trace corresponds with a wordline (top electrode) voltage of about 2.5 volts and a bit line (bottom electrode) voltage of about −2.0 volts. The third trace corresponds with a wordline (top electrode) voltage of about 2.5 volts and a bit line (bottom electrode) voltage of about −1.7 volts. The fourth trace corresponds with a wordline (top electrode) voltage of about 2.5 volts and a bit line (bottom electrode) voltage of about −1.4 volts. It can be seen that read current increases in a substantially progressive, and nearly linear fashion in response to increasing intervals of program stress at various levels of stress. For higher program stress, stress intervals are shorter in time to achieve the same amounts of progressive change in resistance. For example, about 100 milliseconds (0.1 seconds) of program stress at about 4.8 volts (2.5 volts over −2.3 volts) results in a read current of about 95 microamps. For program stress at about 4.5 volts (2.5 volts over −2.0 volts), one second of stress is used to achieve a read current of about 95 microamps.

Figure 7:
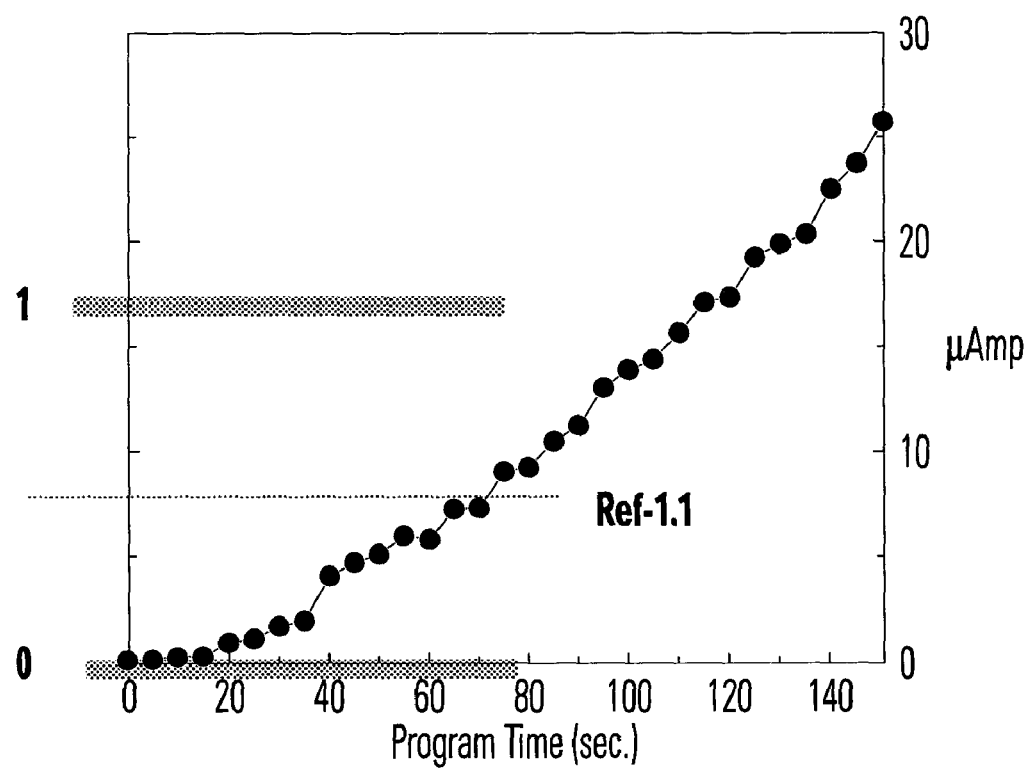
FIG. 7 illustrates a reference current value Ref-1.1 suitable for measuring data in a memory cell programmed according to the present invention.

FIG. 7 shows the read current versus program time graph of FIG. 6, superimposed with a data level threshold and reference current values. Thus data representing one bit can be programmed into the memory cell by setting a reference current Ref-1.1 at around eight microamps. To program the memory cell for storing a data value equal to 1, low voltage program stress would be applied for about 100 seconds. To store a data value equal to 0, no program voltage stress would be applied.

Figure 8:
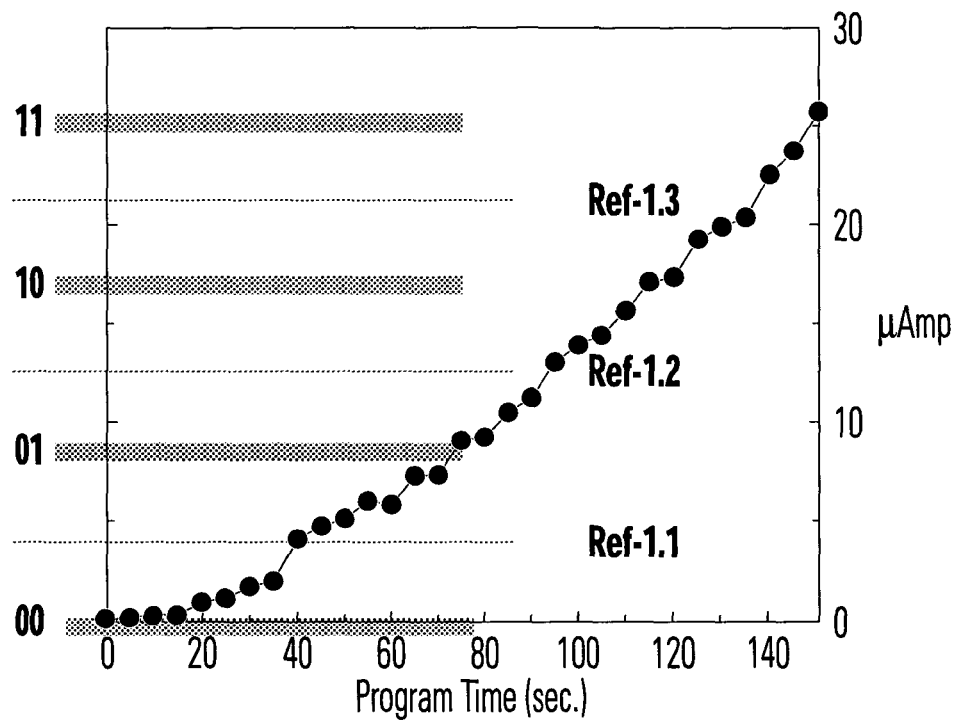
FIG. 8 illustrates three reference current values, Ref-1.1, Ref-1.2, Ref-1.3, suitable for measuring two bits of data in a memory cell programmed according to the present invention.

FIG. 8 shows the read current versus program time graph of FIG. 6, superimposed with a data level threshold and reference current values for storing two bits per cell. To store a data value 00, no program stress is applied. To store a data value 01, program stress is applied for about 75 seconds. To store a data value 10, program stress is applied for about 110 seconds. To store a data value 11, program stress is applied for about 150 seconds. Reference current sources are set for the purposes of sensing the data values. A reference current Ref-1.1 is set in this example at about four microamps. A reference current Ref-1.2 is set in this example at about 12 microamps. A final reference current Ref-1.3 is set in this example at about 21 microamps. By comparing the reference currents with the read current, the data values can be detected.

Figure 9:
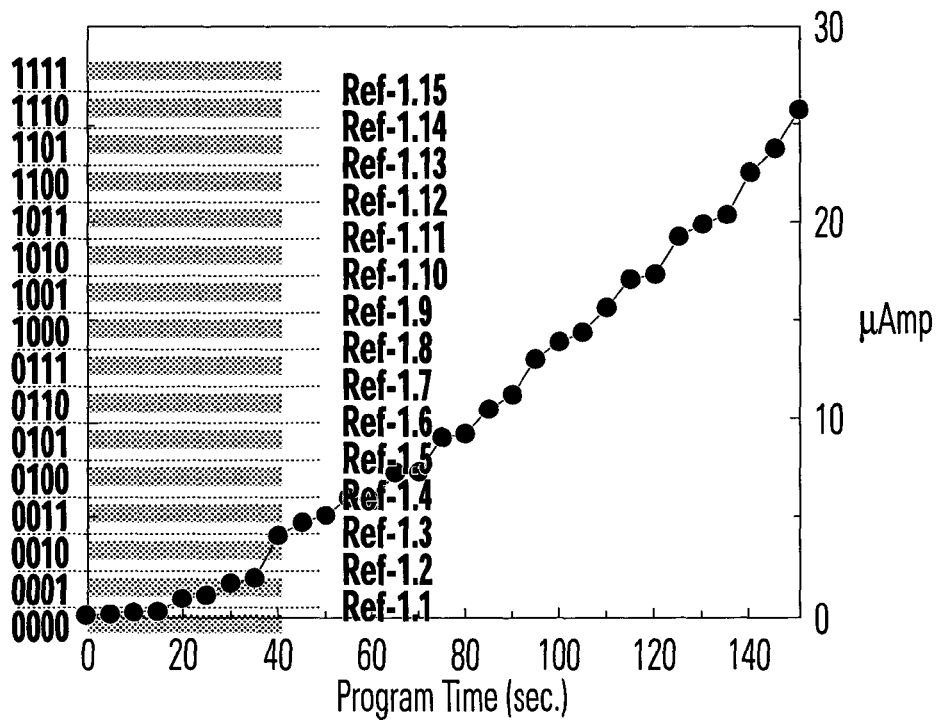
FIG. 9 illustrates 15 reference current values suitable for measuring four bits of data in a memory cell programmed according to the present invention.

FIG. 9 shows the read current versus program time graph of FIG. 6, superimposed with a data level threshold and reference current values for storing four bits per cell. As can be seen, the program times and reference current levels are set more closely to achieve more bits per cell. However, the differences in program times and reference currents are sufficient for known sensing technologies, such as have been deployed for multilevel flash memory, read-only memory and the like, to achieve four bits per cell, or more.

Figure 10:
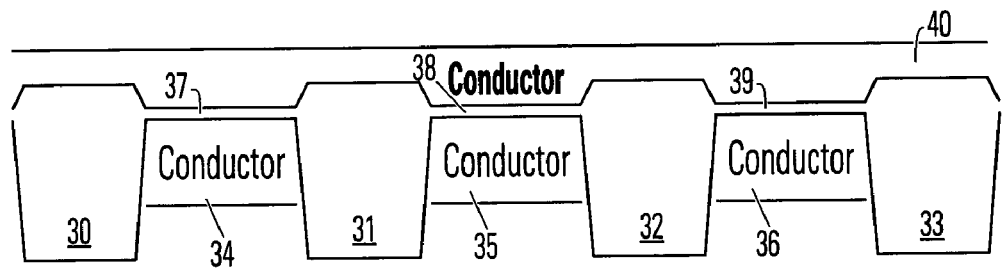
FIG. 10 illustrates a basic array structure for an array of memory cells according to the present invention.

FIG. 10 is a cross-sectional view of a memory array structure for a programmable resistor eraseless memory according to the present invention. The structure includes isolation trenches 30, 31, 32, 33, which extend in lines perpendicular to the page. Between the isolation trenches 30, 31, 32, 33, bottom electrode conductors 34, 35, 36 extend in parallel lines. The bottom electrode conductors 34, 35, 36 are formed on an insulating substrate, or by diffusion of impurities into a semiconductor substrate. Ultra-thin oxide layers 37, 38, 39 are formed over the bottom electrode conductors 34, 35, 36. The ultra-thin oxide layers 37, 38, 39 are formed in a single deposition step forming a unitary thin film over the array area of the chip, in one approach. In an alternative approach, the ultra-thin oxide is patterned to match the layout of the memory cells. Top electrode conductors, including conductor 40, overlie the ultra-thin oxide layers 37, 38, 39, and comprise a plurality of parallel lines of conductors generally orthogonal to the bottom electrode conductors, forming memory cells at intersections. The bottom electrode conductors 34, 35, 36 are arranged as one of bit lines and wordlines for an array structure. Likewise, the top electrode conductors (e.g. conductor 40) are arranged as the other of the wordlines and bit lines for the array.

Figure 11:
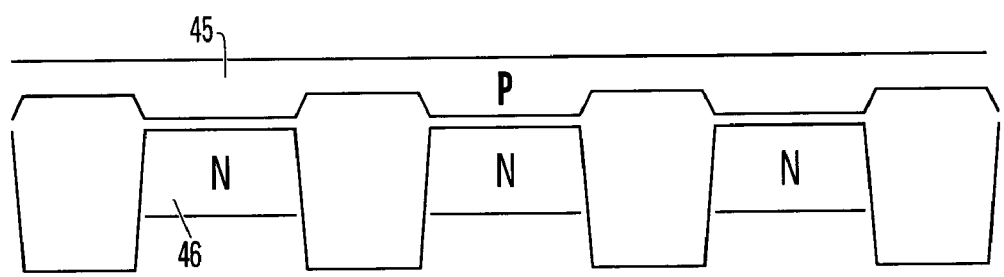
FIG. 11 illustrates a basic array structure for an array of memory cells such as shown in FIG. 2 according to the present invention.

FIG. 11 shows a cross-sectional view of a memory array structure like that shown in FIG. 10, with the top electrode conductor 45 formed using p-type polysilicon, and the bottom electrode conductor 46 formed using n-type buried diffusion well. Although not shown, the n-type diffusion region well is formed in an isolation well formed with p-type diffusion, inside a deep n-type well, supporting application of negative voltage to the bottom electrode in some embodiments. All other components of the structure of FIG. 11 are like those in FIG. 10, and not described again.

Figure 12:
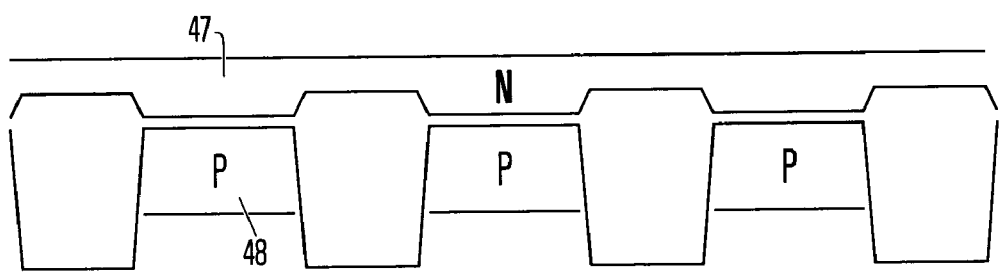
FIG. 12 illustrates a basic array structure for an array of memory cells such as shown in FIG. 3 according to the present invention.

FIG. 12 shows a cross-sectional view of a memory array structure like that shown in FIG. 10, with the top electrode conductor 47 formed using n-type polysilicon, and the bottom electrode conductor 48 formed using p-type buried diffusion. All other components of the structure of FIG. 12 are like those in FIG. 10, and not described again.

Figure 13:
FIG. 13 illustrates a basic manufacturing process for a memory cell according to the present invention.

FIG. 13 illustrates the basic manufacturing process for formation of a programmable resistor eraseless memory cell according to the present invention. The process includes forming a bottom electrode conductor 50, forming a dielectric layer 51 on the conductor 50 characterized by progressive breakdown at low voltage, and forming a top electrode conductor 52 on the dielectric layer 51. The bottom electrode 50 is conditioned in some embodiments for formation of an ultra-thin oxide, or other dielectric layer, prior to formation of the dielectric layer. For example, the conductor layer may be polished or etched to form a smooth surface prior to deposition or growth of the dielectric layer. In other embodiments, the bottom electrode conductor 50 may include a thin film nucleation or catalyzing layer to facilitate dielectric formation. Also, the bottom electrode conductor may include a barrier to diffusion of material into the dielectric layer, to preserve predictable progressive breakdown behavior.

Figure 14:
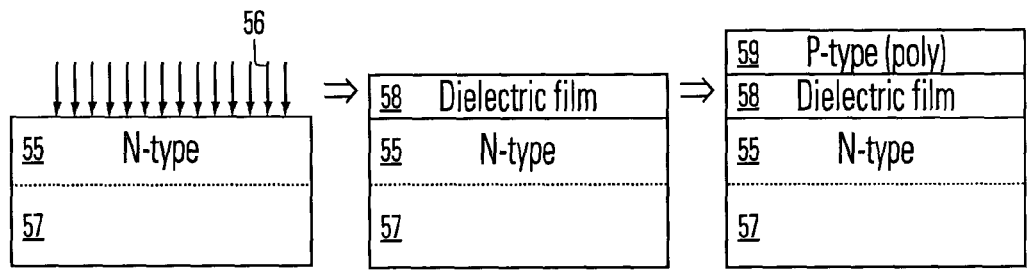
FIG. 14 illustrates a basic manufacturing process for a memory cell such as shown in FIG. 2 according to the present invention.

FIG. 14 illustrates the process of FIG. 13, where the bottom electrode conductor 55 is formed by implantation of n-type dopants 56 into a diffusion region in a semiconductor substrate 57. In a next step, a dielectric layer 58 is formed on the conductor 55, which is characterized by progressive breakdown at low voltage. Finally, a top electrode conductor 59 comprising p-type polysilicon is formed on the dielectric layer 58.

Figure 15:
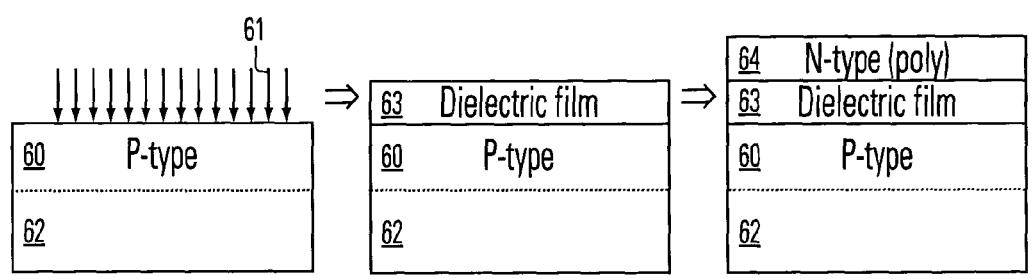
FIG. 15 illustrates a basic manufacturing process for a memory cell such as shown in FIG. 3 according to the present invention.

FIG. 15 illustrates the process of FIG. 13, where the bottom electrode conductor 60 is formed by implantation of p-type dopants 61 into a diffusion region in a semiconductor substrate 62. In a next step, a dielectric layer 63 is formed on the conductor 60, which is characterized by progressive breakdown at low voltage. Finally, a top electrode conductor 64 comprising n-type polysilicon is formed on the dielectric layer 63.

Figure 16:
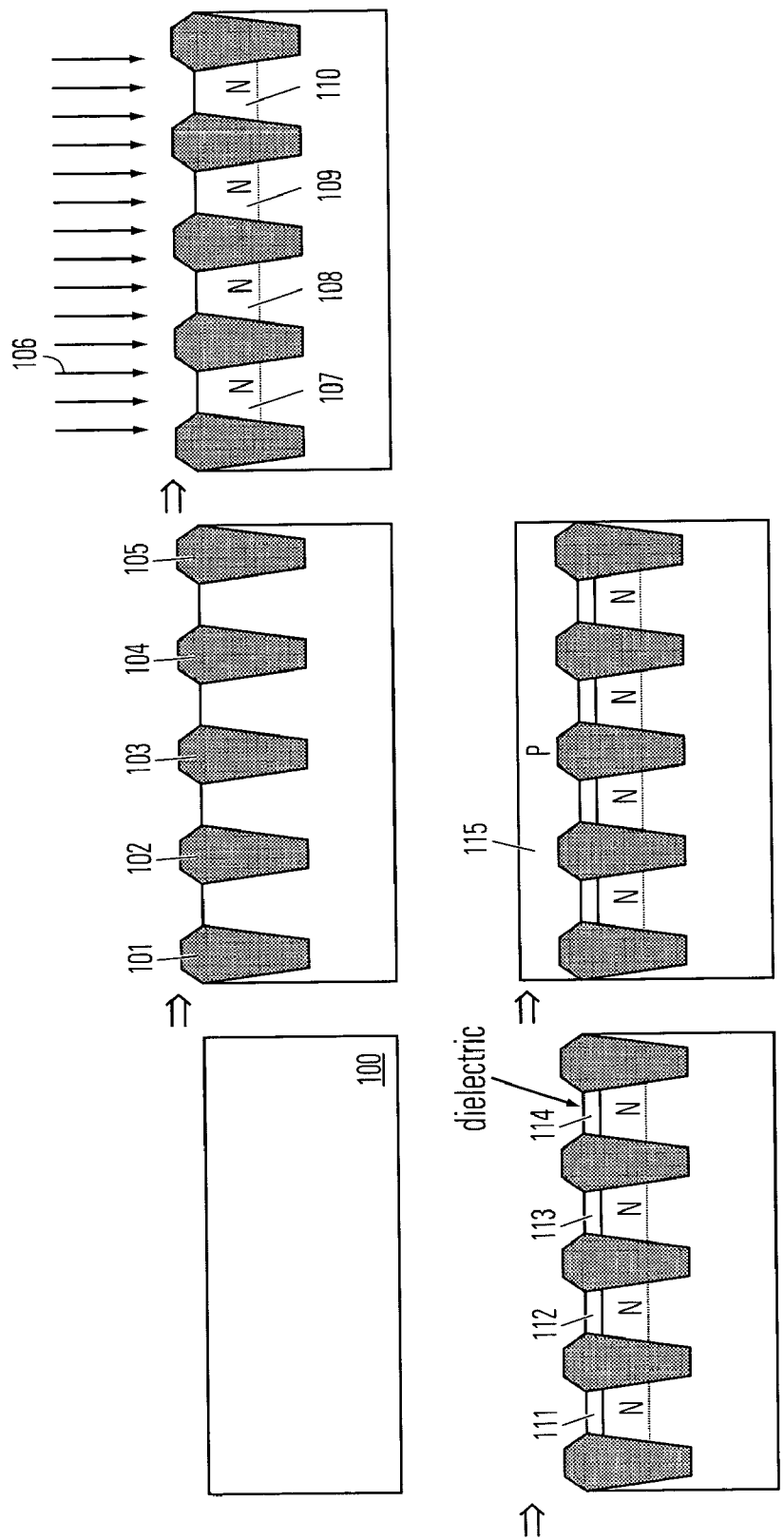
FIG. 16 illustrates a basic manufacturing process for an array structure such as shown in FIG. 11 according to the present invention.

FIG. 16 illustrates one manufacturing procedure for a memory array comprising programmable resistor eraseless memory cells according to the present invention. The process flow in FIG. 16 begins with a semiconductor substrate 100, such as single crystal silicon with a p-doping level. Isolation trenches 101–105 are formed and filled with dielectric. The isolation trenches 101–105 are formed using well-known silicon trench isolation STI processes in some embodiments. In alternative embodiments, LOCOS oxidation may be used to form isolation structures. N-type implants 106 are deposited to form buried diffusion regions 107–110 between the isolation trenches 110–105. In some embodiments, a deep n-well is formed, followed by a p-type isolation well within the deep n-well. The n-type buried diffusion regions are formed within the p-type isolation well. The deep n-well and isolation well may be formed either before or after formation of the trenches 110–105.

After formation of the n-type buried diffusion regions 107–110, ultra-thin dielectric layers 111–114 are formed on the surface of the n-type buried diffusion regions. The surface of the n-type buried diffusion regions on the single crystal silicon is found to form a good surface for formation of oxynitride suitable for use in memory cells according to the present invention. In other embodiments, the surface may be treated in preparation for formation of the dielectric layers.

Next, a p-type polysilicon layer 115 is deposited and patterned to define word lines orthogonal to the bit lines formed by n-type diffusion regions 107–110. In the intersections of the word lines and the bit lines, diode-like programmable resistor eraseless memory cells are formed, which can be accessed using word line and bit line decoding structures well-known in the art.

Figure 17:
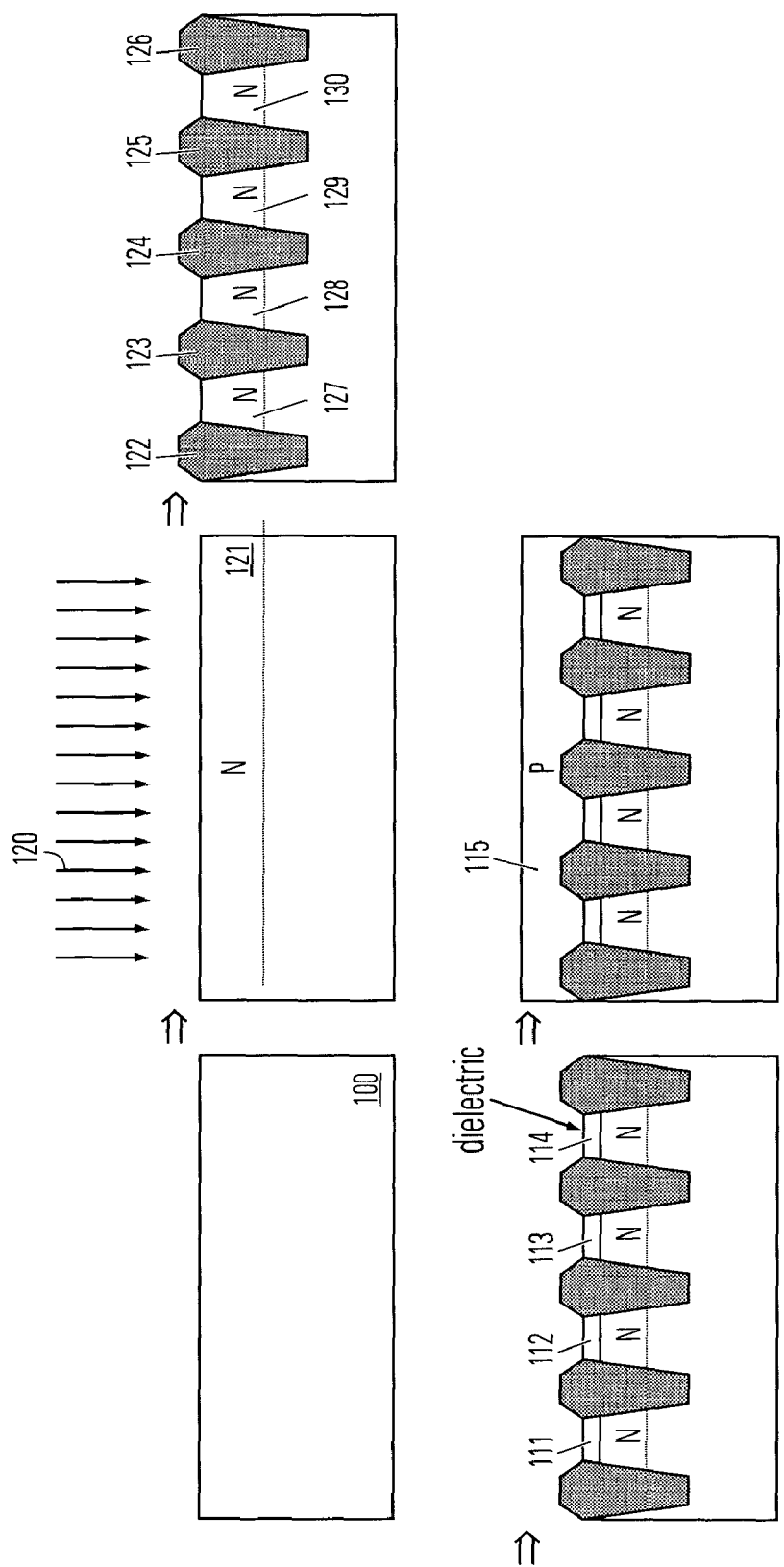
FIG. 17 illustrates an alternative basic manufacturing process for an array structure as shown in FIG. 11 according to the present invention.

FIG. 17 illustrates an alternative manufacturing process for a memory array according to the present invention, in which elements similar to those in FIG. 16 are given like reference numerals. According to the process flow in FIG. 17, the process begins with silicon substrate 100. An array area is patterned using photolithography, or otherwise, and implanted with n-type dopants 120 to form an n-type diffusion region 121 on the surface of the substrate 100. Isolation trenches 122–126 are cut through the n-type diffusion region 121 and filled with dielectric, forming buried diffusion bit lines 127–130. From this point, the process flow proceeds as described above with respect to FIG. 16.

Figure 18:
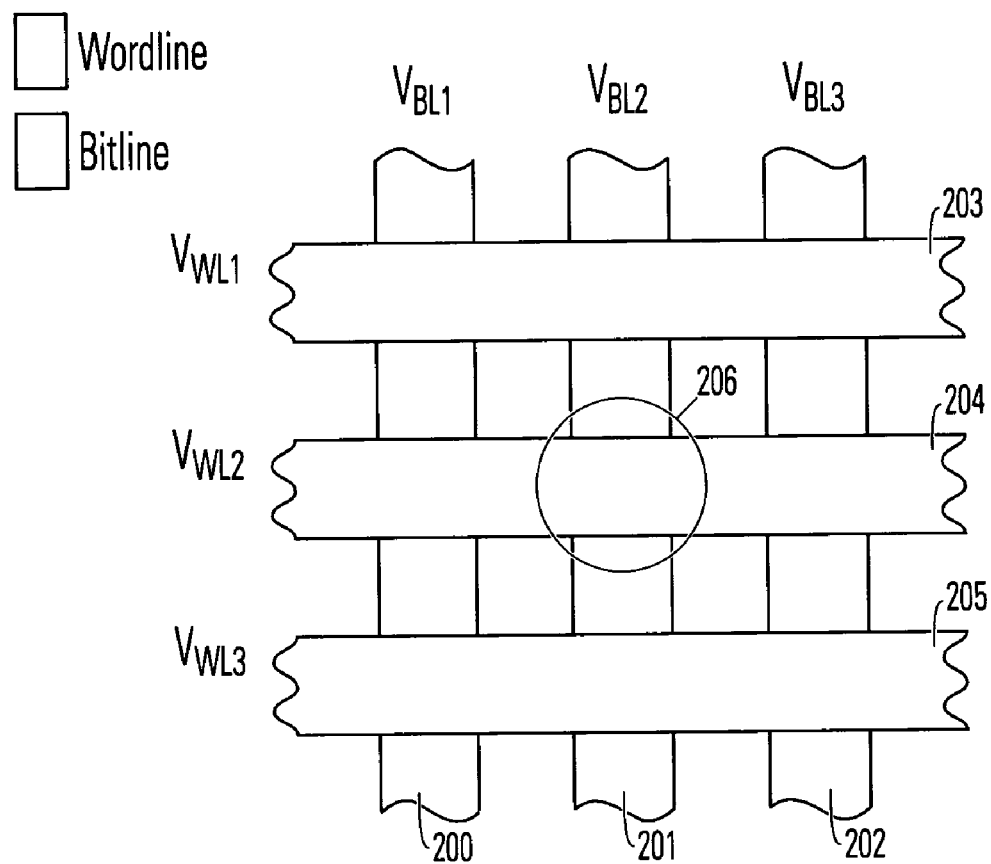
FIG. 18 shows a top view of an array structure manufactured according to the processes of FIGS. 16 or 17 according to the present invention.

The manufacturing processes described with respect to FIGS. 16–17 result in an array structure, such as shown in top view in FIG. 18. The array structure has buried diffusion bit lines 200–202 and polysilicon word lines 203–205, are arranged generally orthogonally to one another. Memory cells are formed at intersections, such as intersection 206.

Figure 19:
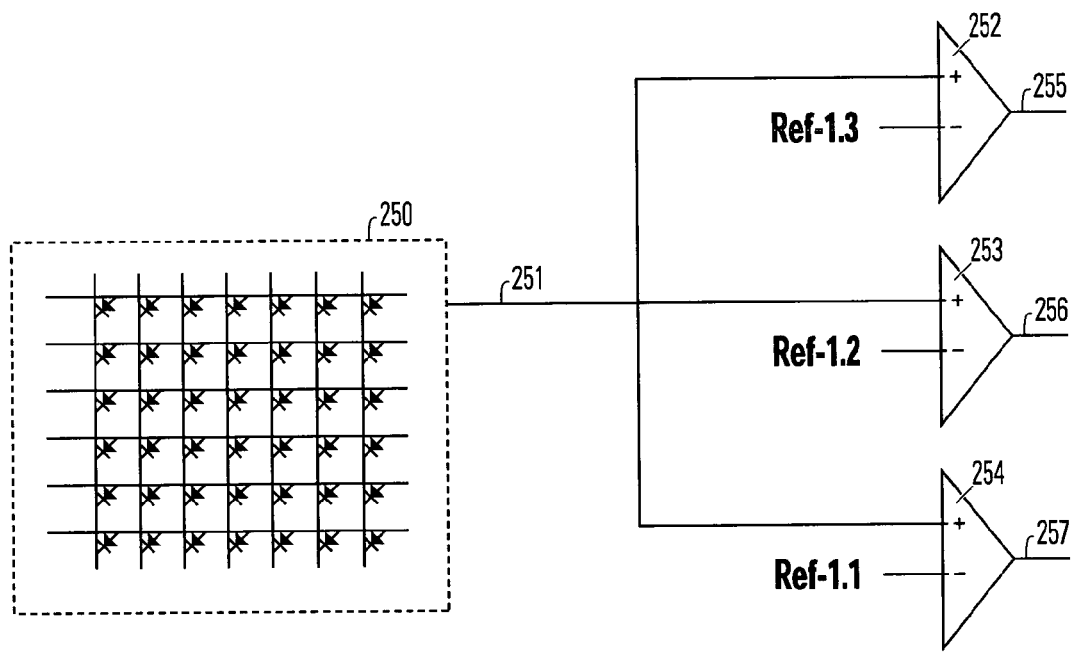
FIG. 19 is a schematic diagram of an array and sense circuitry architecture according to the present invention.
Figure 20:
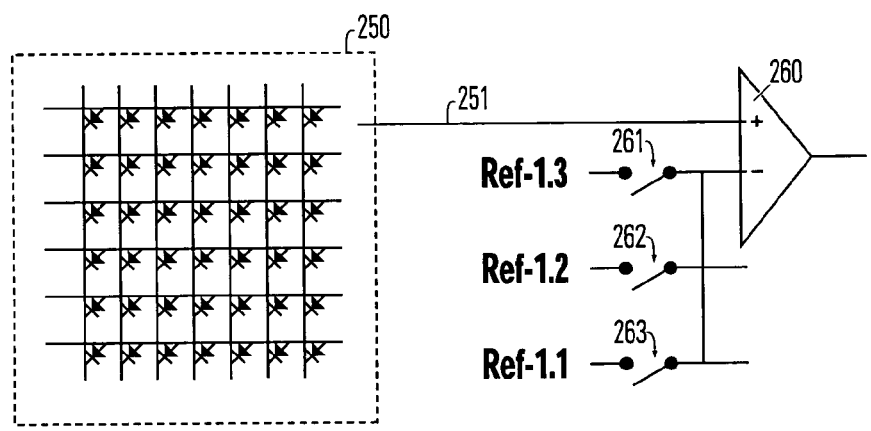
FIG. 20 is a schematic diagram of an alternative array and sense circuitry architecture according to the present invention.

FIGS. 19 and 20 illustrate alternative sensing architectures for memory arrays according to the present invention. In FIGS. 19 and 20, the memory array is represented by array 250 which includes a plurality of word lines arranged generally horizontally in the figure, and a plurality of bit lines arranged generally vertically. Memory cells are represented by the diode symbols, corresponding to diode-like programmable resistor eraseless memory cells, such as can be made by the processes of FIGS. 16–18. Using standard decoding techniques, one of the bit lines is coupled to a data out line 251. The data out line 251 is coupled to current mode sense amplifiers 252–254, where three sense amplifiers are used for determining two bits of data per cell as illustrated with respect to FIG. 8. Each current mode sense amplifier is coupled to a reference current source. Thus, sense amplifier 252 is coupled to a reference current source supplying reference current Ref-1.3. Sense amplifier 253 is coupled to a reference current source supplying reference current Ref-1.2. Sense amplifier 254 is coupled to a reference current source supplying reference current Ref-1.1. The outputs of the sense amplifiers on lines 255–257 are then decoded to determine the value of the two bits stored in the selected memory cell.

FIG. 20 shows an alternative sensing architecture, which the data out line 251 from the array 250 is coupled to a single current mode sense amplifier 260. The reference current supplied on line 265 to the sense amplifier 260 is selected by switches 26–263, which are respectively coupled to current sources supplying, respectively, the reference currents Ref-1.3, Ref-1.2 and Ref-1.1. For other embodiments, digital sense amplifiers are not used, and the data stored in the memory cells is delivered to an output as an analog value.

Figure 21:
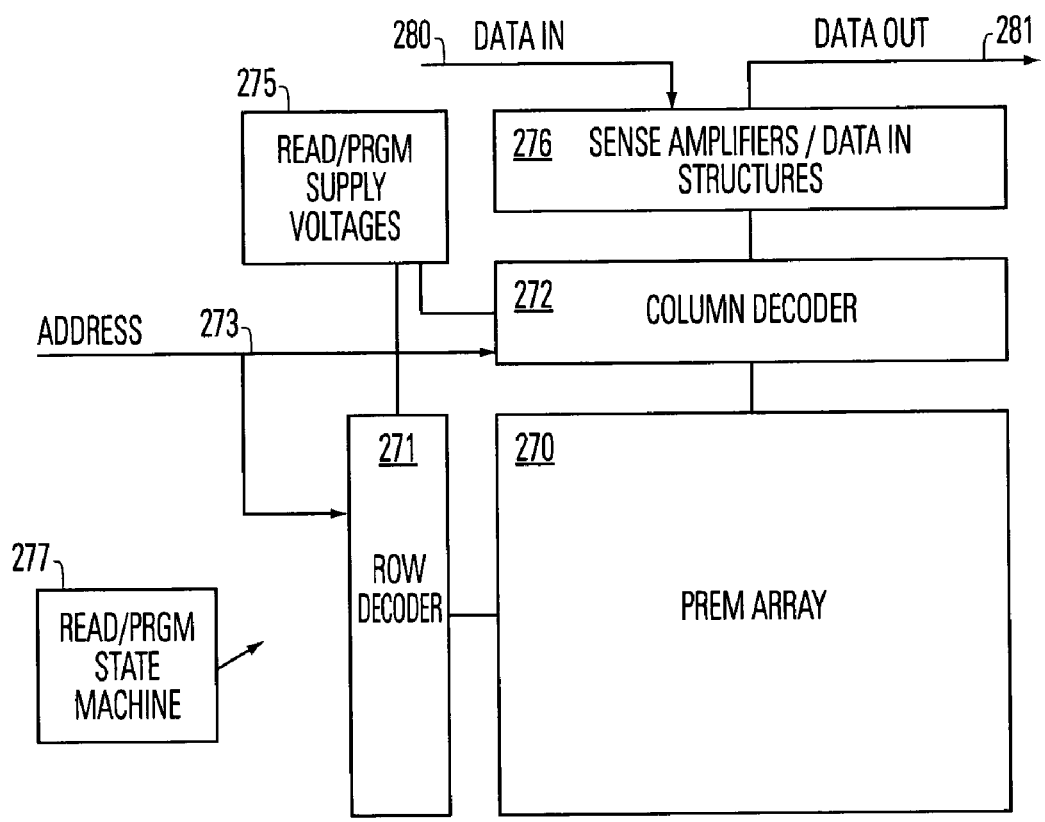
FIG. 21 illustrates components of an integrated circuit implementing a memory of according to the present invention.

A simplified block diagram of a memory device employing the programmable resistor eraseless memory PREM array 270 is shown in FIG. 21. The memory device includes a row decoder 271 and a column decoder 272, which are connected to an address bus 273. Supply voltages for read and program operations are supplied by voltage source 275, via the column decoder 272 and row decoder 271 to the selected memory cells in the array 270. Sense amplifiers and data-in structures 276 are coupled to the outputs of the column decoder 272, to input data bus 280 and to output data bus 281. A read and program state machine 277 is coupled to the components of the memory device. The state machine may be implemented by dedicated logic, by programmable logic array structures, by instructions executed by a general-purpose processor, or by a combination of such implementations.

Figure 22:
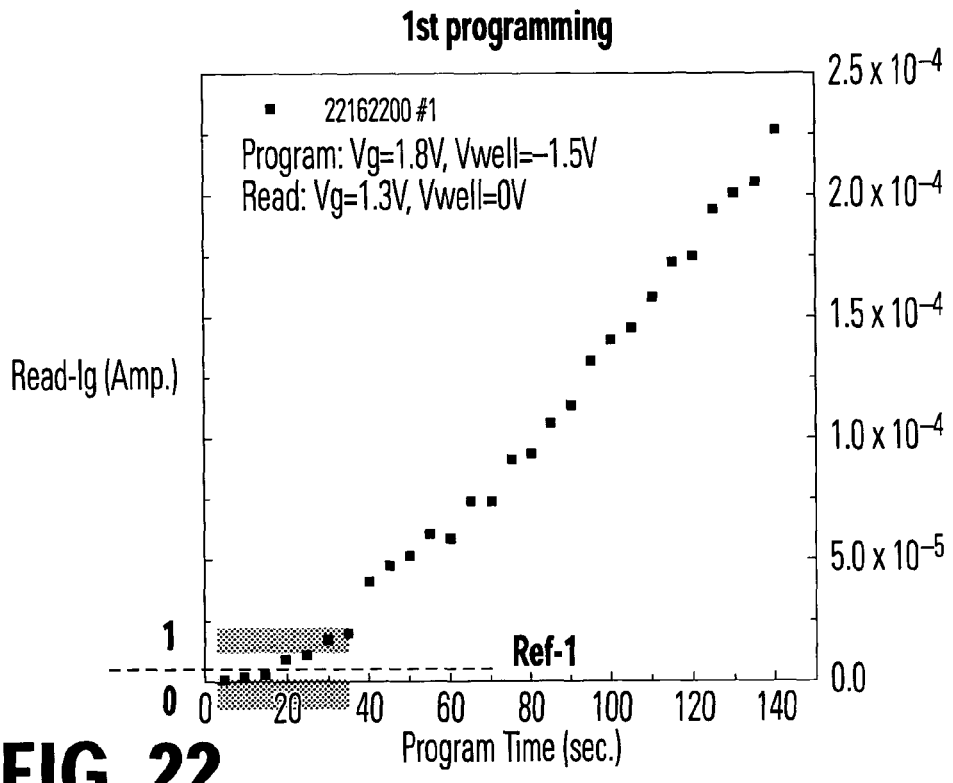
FIG. 22 illustrates a reference current level adapted for sensing one bit of data after a first programming round in a multiple time programming embodiment of the present invention.
Figure 23:
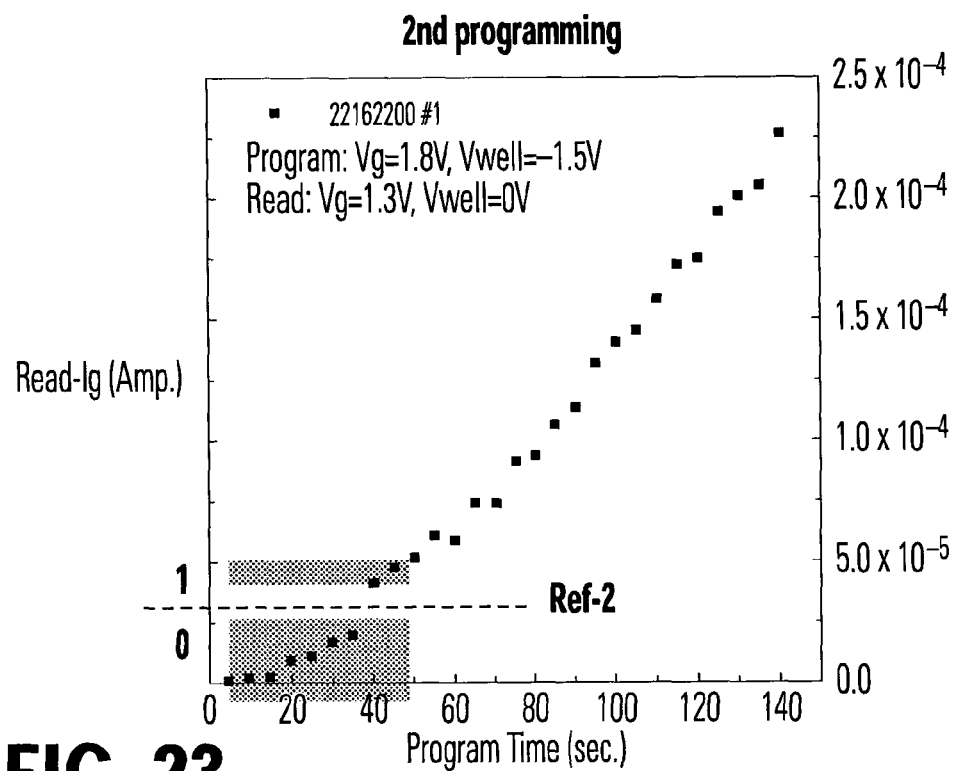
FIG. 23 illustrates a reference current level adapted for sensing one bit of data after a second programming round in a multiple time programming embodiment of the present invention.
Figure 24:
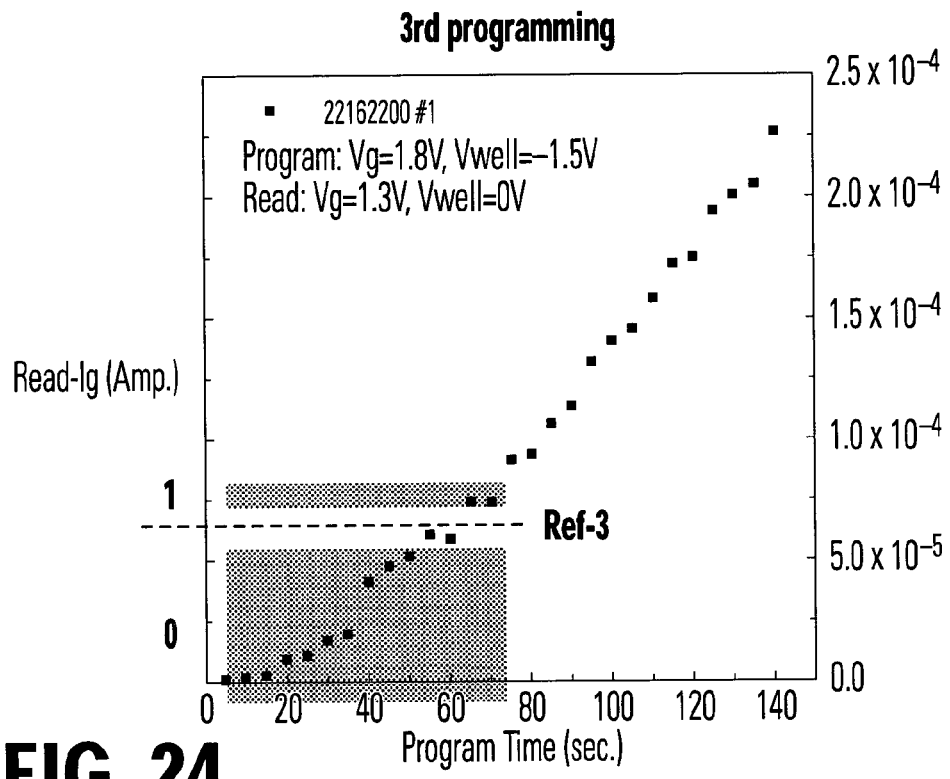
FIG. 24 illustrates a reference current level adapted for sensing one bit of data after a third programming round in a multiple time programming embodiment of the present invention.
Figure 25:
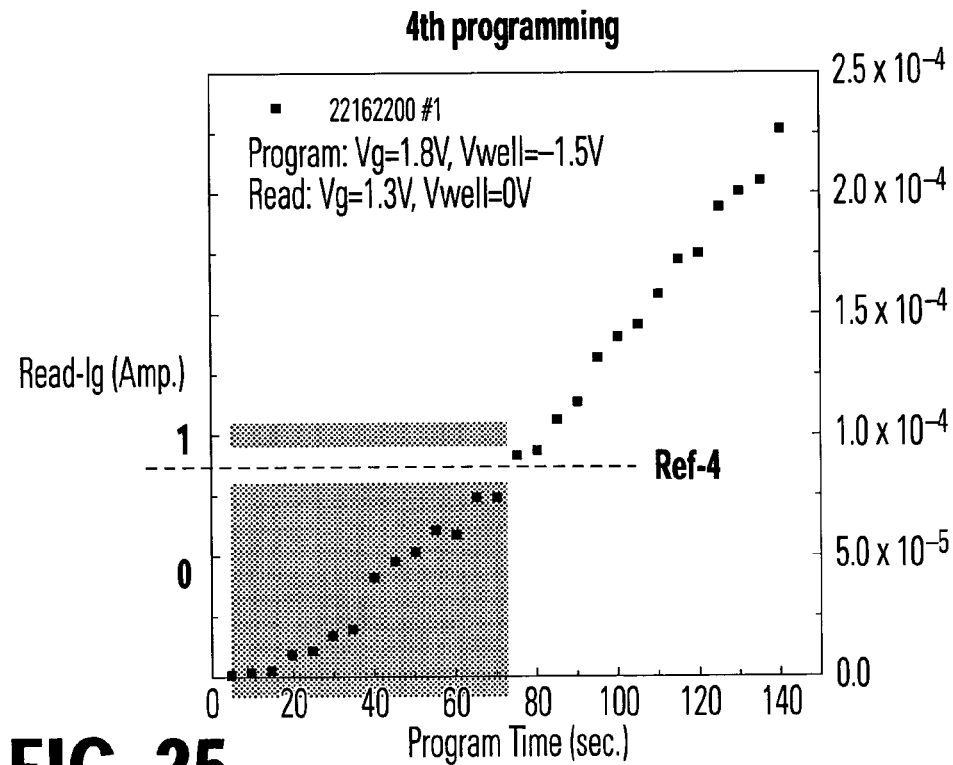
FIG. 25 illustrates a reference current level adapted for sensing one bit of data after a fourth programming round in a multiple time programming embodiment of the present invention.

As described above, the programmable resistor eraseless memory array can be used for storing multiple bits per cell. In other embodiments, it can be adapted for multiple programming rounds. As can be seen with reference to FIGS. 22–25, a first programming round may be implemented setting the reference current for sensing a single bit at the level Ref-1 as illustrated in FIG. 22. A second programming round may be implemented by setting the reference current for sensing a single bit at the level Ref-2 as shown in FIG. 23. A third programming round may be implemented by setting the reference current for sensing a single bit at the level Ref-3 as shown in FIG. 24. A fourth programming round may be implemented by setting the reference current for sensing a single bit at the level Ref-4 as shown in FIG. 25. The number of times which a memory cell may be programmed to be adapted to a particular implementation, and depends on the ability to reliably program amounts of progressive change in resistance and to discriminate between current levels generated when accessing the memory cells. The read/program state machine (e.g. 277 of FIG. 21) is set up to track meet number of programming rounds executed so that the appropriate reference current is supplied to the sensing circuitry.

Figure 26:
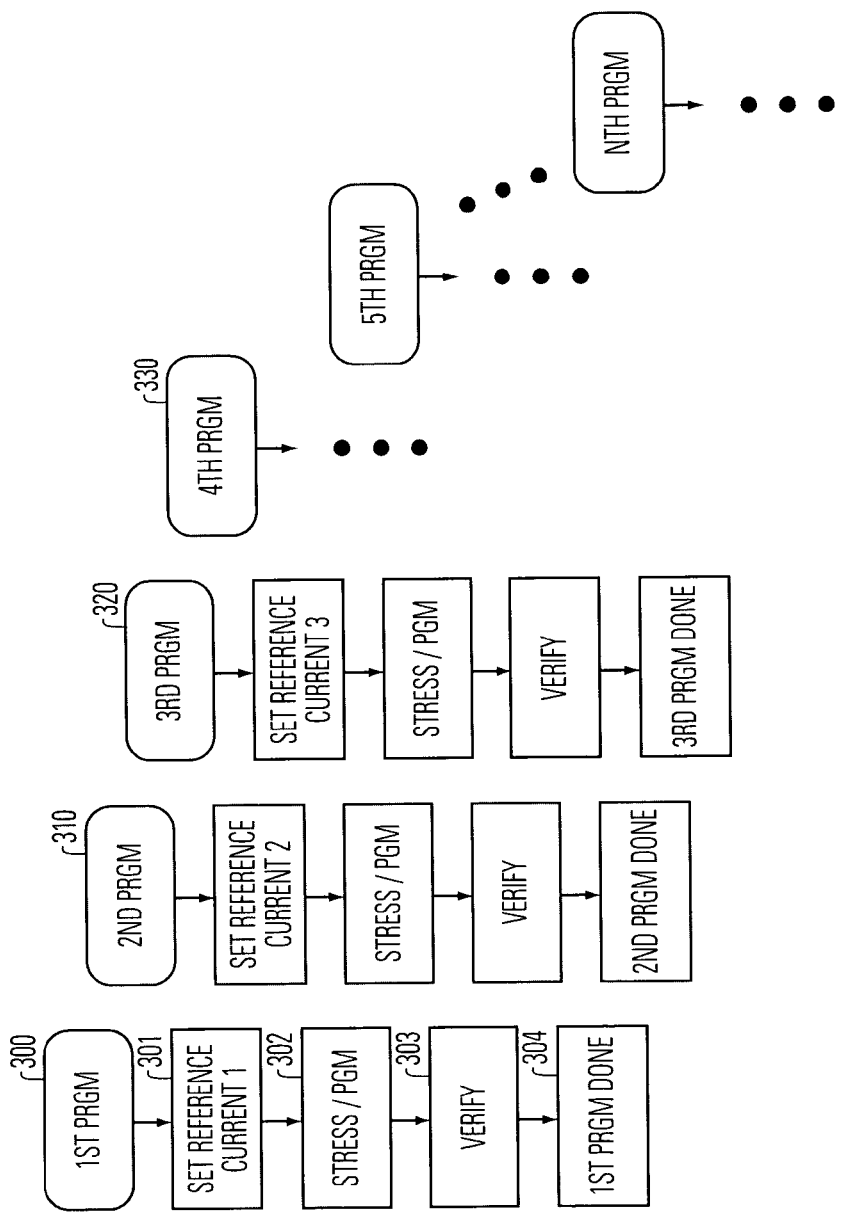
FIG. 26 illustrates a multiple time programming routine according to the present invention.

FIG. 26 illustrates one basic program algorithm for the programmable resistor eraseless memory cell of the present invention. For a first program round 300, a first reference current value is set for sensing and verifying (block 301). A stress/program operation is executed adapted to cause an amount of progressive breakdown such that a program cell will produce an output current when read which is greater than the first reference current value (block 302). The stress applied during the program operation can be set so that success is expected after a single stress cycle. In alternative approaches, the stress applied during a program operation can be set so that progressive changes in resistance are caused incrementally using sequences of shorter pulses, which may vary in length and/or voltage level, or may have consistent length and voltage level, allowing more control over final amounts of progressive changes in properties of the memory cell. Then a verify operation is executed to ensure successful programming (block 303). If the verify fails, then the stress program operation is retried with a next stress pulse in a sequence. If the verify passes, then the first program round is done (block 304). As shown in FIG. 26, a second program round 310, a third program round 320, a fourth program round 330, and so on, can be executed using the same basic process, while setting progressively increasing reference currents.

Three representative program operation algorithms are available, in which a pulse sequence is applied to establish a selected amount of progressive change in the property of the cell, and after each pulse executing according to a retry algorithm, where the retry algorithm includes (1) a verify step, to determine whether the selected level is achieved, and if not then apply a pulse with equal pulse voltage and pulse length in each cycle.

(2) a verify step, to determine whether the selected level is achieved, and if not then apply a pulse with increasing pulse voltage with equal pulse length in each successive cycle.

(3) a verify step, to determine whether the selected level is achieved, and if not then apply a pulse with increasing pulse length with equal pulse voltage in successive cycles.

(4) a verify step, to determine whether the selected level is achieved, and if not then apply a pulse in successive cycles, where the pulse is changed in one or both of pulse width and pulse height during one or more steps of a sequence of successive cycles.

In one preferred approach with the cell structure of FIG. 2, the programming process includes fixing the n-diffusion electrode at about −2V, and stepping the p-poly electrode from about 0.5V to about 2V, increasing 0.1V per step with constant pulse width (for example 1 ms or 10 ms), with a verify step between each pulse, and stopping when the cell passes the verify step.

For constant voltage operation according to an alternative with a cell structure as shown in FIG. 2, the process includes fixing the n-diffusion electrode at about −2V and the p-poly electrode at about 2V to apply constant pulse heights, and applying pulses having constant pulse width (for example 1 ms or 10 ms), with a verify step between each pulse, and stopping when the cell passes the verify step. Of course, the pulse widths and pulse heights can be varied according to the needs of a particular system.

The programmable resistor eraseless memory of the present invention demonstrates excellent program disturb and read performance. The program disturb performance can be understood with reference to FIGS. 27A–27D. In FIG. 27A, a schematic representation of a section of an array is presented, showing word lines 400–403 and bit lines 410–413. A memory cell A at the intersection of word line 401 and bit line 411 is to be programmed by applying about 1.8 volts to the electrode on the word line 410 and about negative 1.5 volts to the electrode on the bit line 411. A memory cell B at the intersection of word line 401 with an adjacent bit line 412, receives the 1.8 volt word line potential, but the bit line 412 is grounded. A memory cell C at the intersection of bit line 411 with an adjacent word line 402, receives the negative 1.5 volt bit line potential, while the word line is grounded.

FIG. 27B is a representation of selected memory cell A, with the top electrode 420 formed with p-type polysilicon, the bottom electrode 421 formed by an n-type buried diffusion (or well), and the inter-electrode dielectric 422 formed by 15 Angstroms of oxynitride. The program potential of about 3.3 volts across the electrodes in a forward bias mode for the p-n junction of the device, applying voltages having absolute values of less than 2 volts, causes a progressively decreasing resistance across the electrodes, resulting in progressively increasing read current, as shown in FIG. 6.

FIG. 27C shows the condition of unselected memory cell C, with the top electrode 423 formed with p-type polysilicon, the bottom electrode 424 formed by an n-type buried diffusion (or well), and the inter-electrode dielectric 425 formed by 15 Angstroms of oxynitride. The bottom electrode receives the negative 1.5 volts bias, while the top electrode is grounded. This is a reverse bias condition for the p-n junction.

FIG. 27D shows the condition of unselected memory cell B, with the top electrode 426 formed with p-type polysilicon, the bottom electrode 427 formed by an n-type buried diffusion (or well), and the inter-electrode dielectric 428 formed by 15 Angstroms of oxynitride. The top electrode of memory cell B receives the 1.8 volt bias, while the bottom electrode is grounded.

Figure 28:
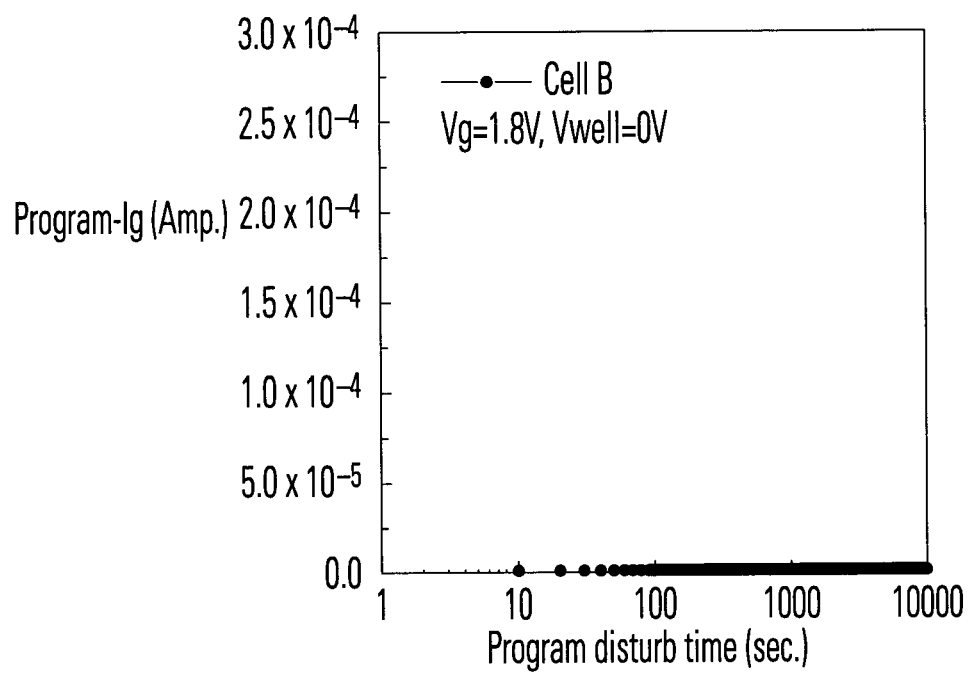
FIG. 28 is a graph showing program disturb conditions for the unselected cell of FIG. 27C, measured as described with reference to FIG. 27A–27D.
Figure 29:
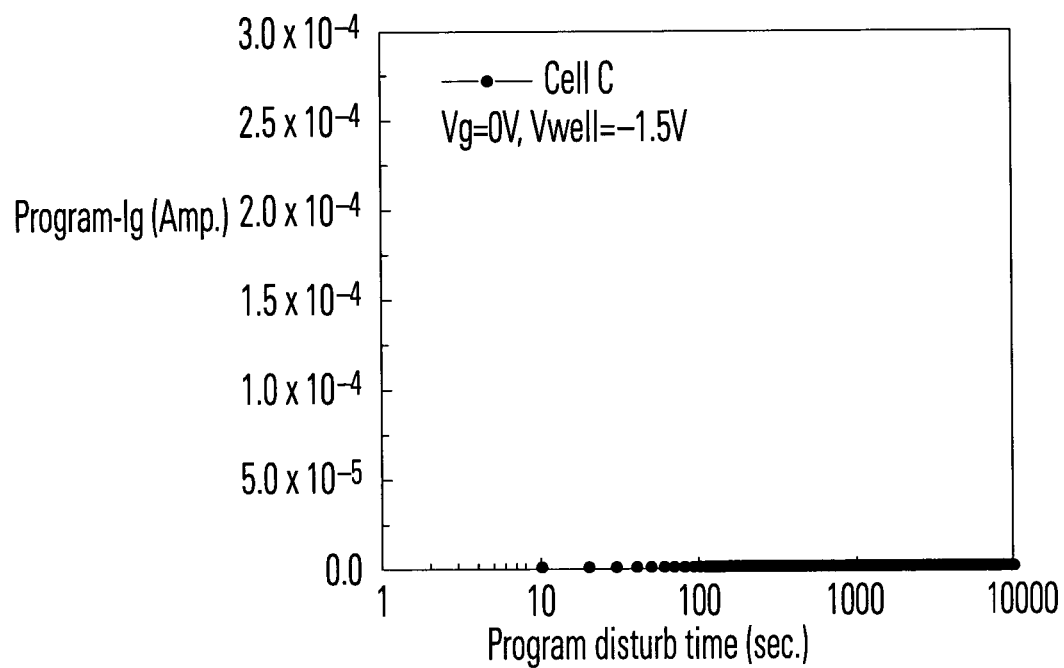
FIG. 29 is a graph showing program disturb conditions for the unselected cell of FIG. 27D, measured as described with reference to FIG. 27A–27D.

The graph in FIG. 28 shows that program current remains very low after 10000 seconds of program stress on the memory cell biased like memory cell B. The graph in FIG. 29 shows that program current remains very low after 10000 seconds of program stress on the memory cell biased like memory cell C. Therefore, program disturb is not observed at the scale of the Figures.

Figure 30A:
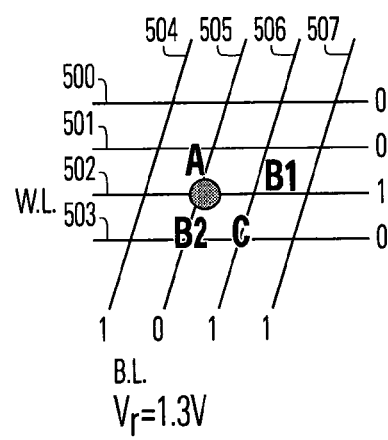
FIGS. 30A–30D illustrate reading and read disturb conditions for a memory array according to the present invention.

The read operation for the programmable resistor eraseless memory of the present invention can be understood with reference to FIGS. 30A–30D. In FIG. 30A, a schematic representation of a section of an array is presented, showing word lines 500–503 and bit lines 504–507. A memory cell A at the intersection of word line 502 and bit line 505 is to be read by applying a read potential of about 1.3 volts to the electrode on the word line 502 and ground to the electrode on the bit line 505. A memory cell B1 at the intersection of word line 502 with an adjacent bit line 506, receives the 1.3 volt word line potential, but the bit line 506 is set at an inhibit potential near 1.3 volts. A memory cell B2 at the intersection of adjacent word line 503 with a bit line 505, receives a zero volt word line potential, but the bit line 505 is also at ground potential. A memory cell C at the intersection of adjacent bit line 506 with an adjacent word line 503, receives a ground potential on the word line, while the bit line receives a 1.3 volt inhibit potential.

Figure 30B:
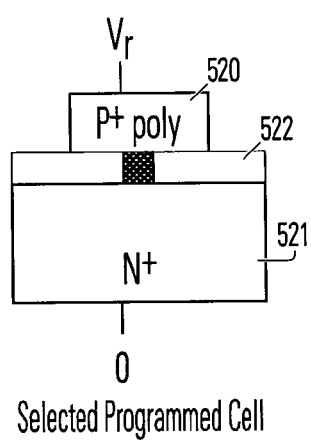

FIG. 30B is a representation of selected memory cell A, with the top electrode 520 formed with p-type polysilicon, the bottom electrode 521 formed by n-type buried diffusion (or well), and the inter-electrode dielectric 522 formed by 15 Angstroms of oxynitride. In the cell shown in FIG. 30B, the dielectric has been programmed to a lower resistance state. The read potential of about 1.3 volts across the electrodes in a forward bias mode for the p-n junction of the device, causes a current to flow in the device which can be sensed.

Figure 30C:
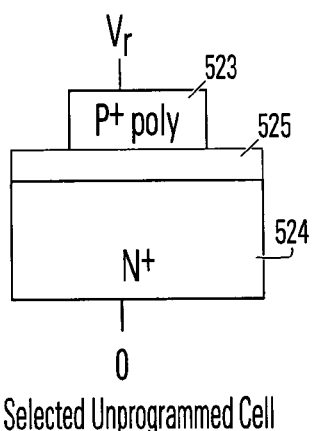

FIG. 30C is a representation of selected memory cell A, with the top electrode 523 formed with p-type polysilicon, the bottom electrode 524 formed by an n-type buried diffusion (or well), and the inter-electrode dielectric 525 formed by 15 Angstroms of oxynitride. In the cell shown in FIG. 30C, the dielectric has not been programmed to a lower resistance state. The read potential of about 1.3 volts across the electrodes in a forward bias mode for the p-n junction of the device, does not cause a current to flow in the device.

Figure 30D:
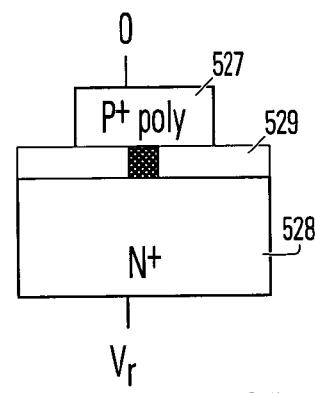

FIG. 30D shows the condition of unselected memory cell B1 when it is in a programmed condition, with the top electrode 527 formed with p-type polysilicon, the bottom electrode 528 formed by an n-type buried diffusion (or well), and the inter-electrode dielectric 529 formed by 15 Angstroms of oxynitride. The bottom electrode receives the 1.3 volt inhibit bias, while the top electrode is grounded. This is a reverse bias condition for the p-n junction, and essentially no current flows. Likewise, memory cells at locations B2 and C of FIG. 30A will have no current flow, whether they are in the programmed lower resistance state, or the unprogrammed higher resistance state.

Figure 31:
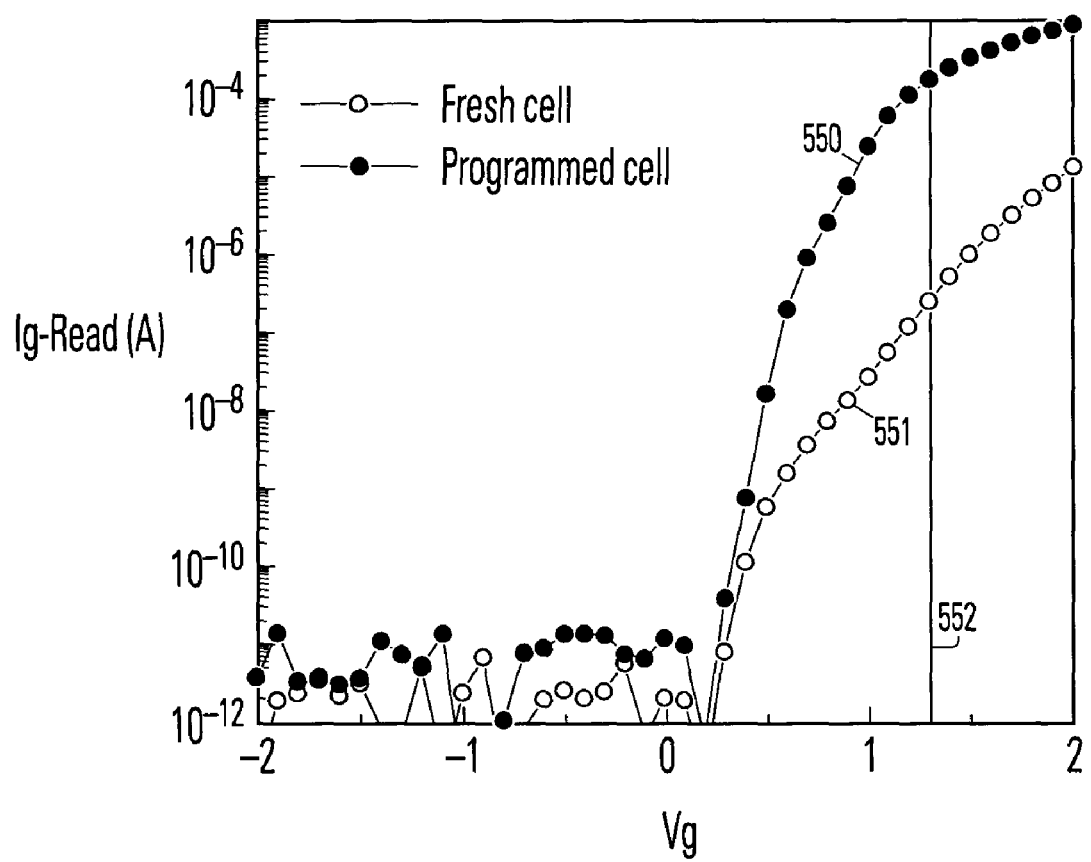
FIG. 31 is a graph of read current versus gate voltage for a selected programmed memory cell and a selected unprogrammed as shown in FIGS. 30B and 30C.

The graph in FIG. 31, shows read current versus gate voltage for a programmed cell on trace 550 and a non-programmed cell ("fresh cell") on trace 551. As can be seen, when the cell is reverse biased ($V_g$<0), essentially no current flows. In a forward bias condition, with $V_g$ above a few tenths of a volt, small amounts of current flow in both a programmed and unprogrammed cell. However, at around 1.3 volts (line 552) in this example, the programmed cell conducts measurably more current than the unprogrammed cell.

Figure 32:
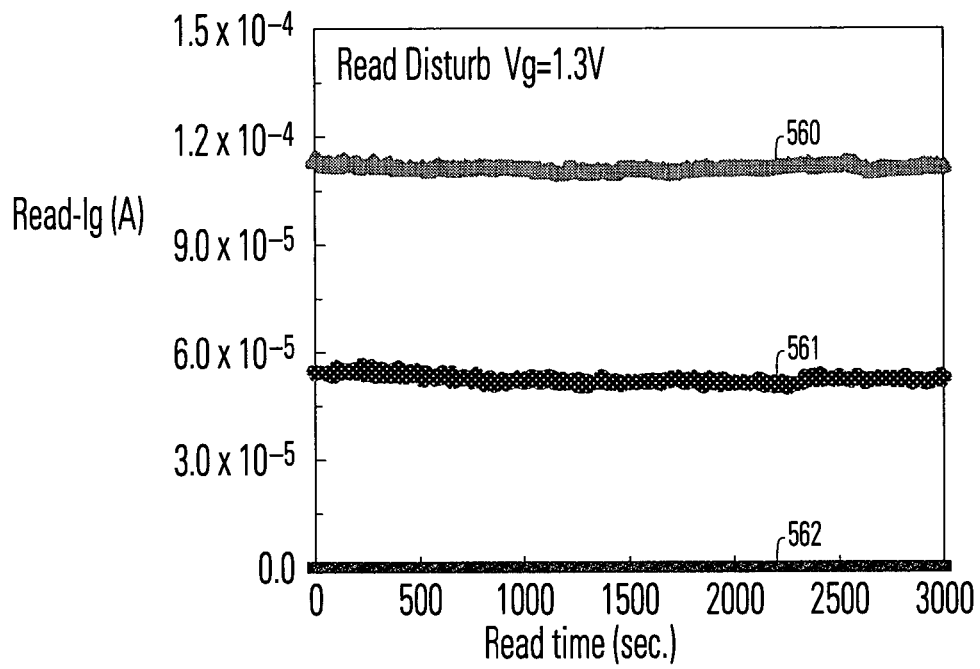
FIG. 32 is a graph of read current versus read time for a selected programmed memory cell and a selected unprogrammed as shown in FIGS. 30B and 30C.

Durability of the memory cell of the present invention is illustrated by the graph in FIG. 32. Read current remains nearly constant for both programmed cells at differing levels of programming, as shown on traces 560 and 561, and for an unprogrammed cell as shown on trace 560 for long read times.

Figure 33:
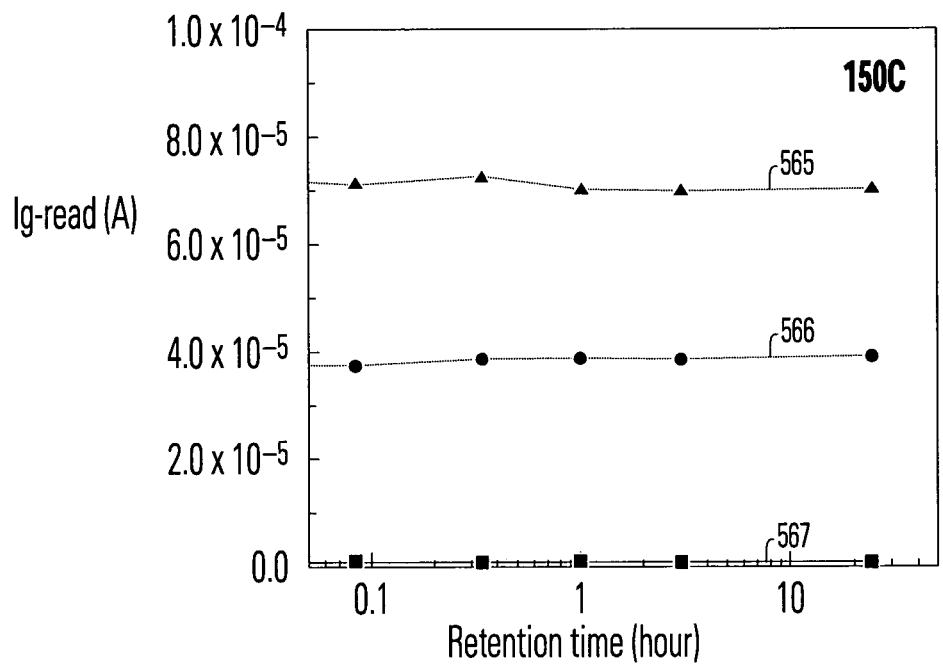
FIG. 33 is a graph of read current versus retention time for a selected programmed memory cell and a selected unprogrammed as shown in FIGS. 30B and 30C.

Also, data retention is very good as shown in the graph of FIG. 33. For a long, high temperature bake, the read currents remain constant for both programmed cells at differing levels of programming, as shown on traces 565 and 566, and for an unprogrammed cell as shown on trace 567.

Figure 34:
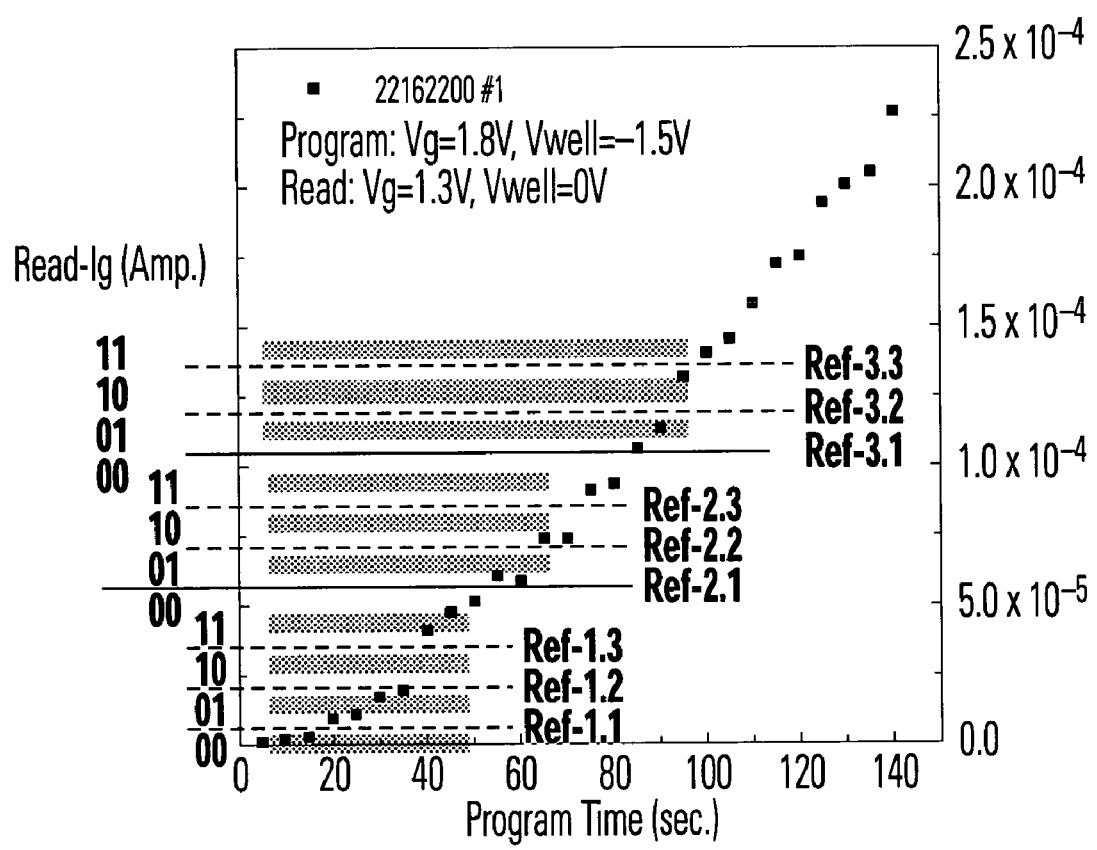
FIG. 34 illustrates reference current values for a multiple time programming, multiple bits per cell embodiment of the present invention.

Because of the excellent stability, durability and retention characteristics of the memory cell of the present invention, it can also be applied to memory arrays storing multiple bits per cell, that can be programmed more than once. FIG. 34 shows the read current versus program time graph of FIG. 6, superimposed with a data level threshold and reference current values for storing two bits per cell, while also supporting multiple rounds of programming. In the first round, to store a data value 00, no program stress is applied. To store a data value 01, program stress is applied for about 25 seconds. To store a data value 10, program stress is applied for about 35 seconds. To store a data value 11, program stress is applied for about 45 seconds. Reference current sources are set for the purposes of sensing the data values. A reference current Ref-1.1 is set in this example at about ten microamps. A reference current Ref-1.2 is set in this example at about 22 microamps. A final reference current Ref-1.3 is set in this example at about 35 microamps. By comparing the reference currents with the read current, the data values can be detected. For a second programming round, the data values are sensed by comparison with reference currents Ref-2.1, Ref-2.2 and Ref-2.3. For the third programming round, the data values are sensed by comparison with reference currents Ref-3.1, Ref-3.2 and Ref-3.3.

Figure 35:
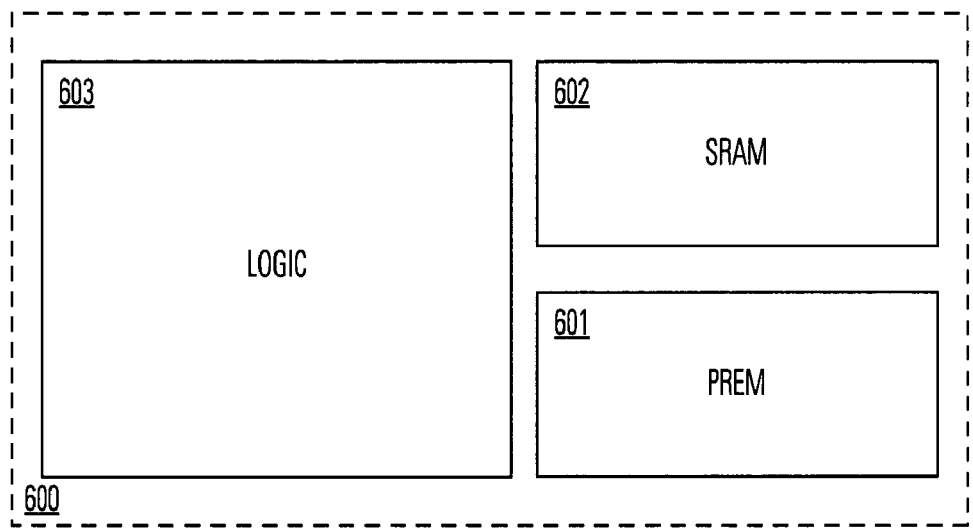
FIG. 35 is a simplified block diagram of an integrated circuit including a programmable resistance, eraseless memory array, special-purpose logic, and static random access memory according to the present invention.
Figure 36:
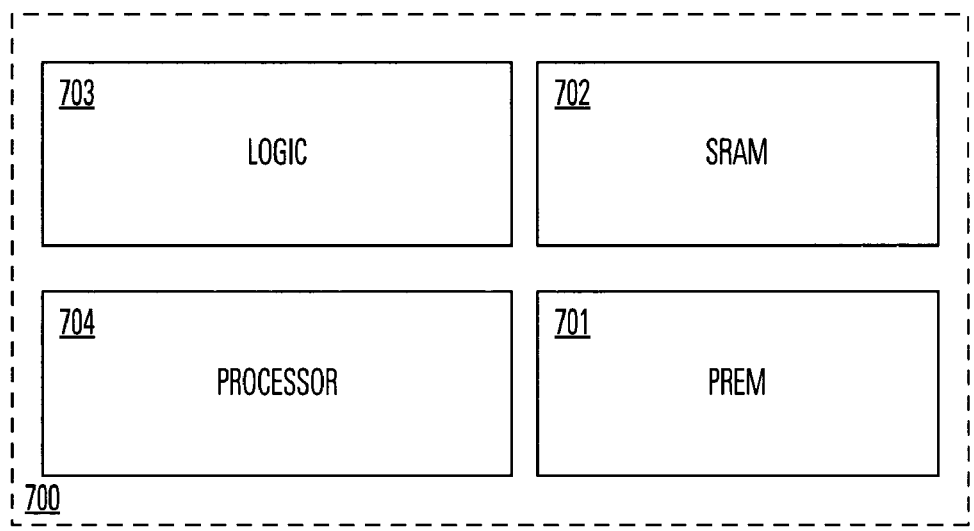
FIG. 36 is a simplified block diagram of an integrated circuit including a programmable resistance, eraseless memory array, a general-purpose processor, special-purpose logic, and static random access memory according to the present invention.

FIGS. 35 and 36 illustrate application of the programmable resistor eraseless memory of the present invention in "system on a chip" (SOC) embodiments. The manufacturing process for the PREM array is fully compatible with standard CMOS manufacturing flows, requiring for example only one additional mask, and therefore is well suited as a compact, non-volatile store in a SOC product. For a cell structure based on p+ polysilicon top electrodes, and n+ buried diffusion bottom electrodes, only one extra mask is needed, to define the implantation step for the $n^+$ buried diffusion while the STI, dielectric film formation and $p^+$-poly gate formation are shared with standard CMOS structure formation. Furthermore, the low voltage operation of the PREM makes it a good choice for low voltage and low power environments.

FIG. 35 illustrates an integrated circuit 600, including a programmable resistance eraseless memory PREM array 601, logic 603, such as application specific logic or programmable gate array logic, and a static random access memory SRAM 602. The PREM array 601 can be used to store more permanent data, such as program specifications for a programmable gate array and persistent control parameters. The SRAM 602 can be used to store working data used during operation of the logic 603.

FIG. 36 illustrates another SOC embodiment of the invention. The integrated circuit 700 of FIG. 36 includes a programmable resistance eraseless memory PREM array 701, logic 703, such as application specific logic or programmable gate array logic, a static random access memory SRAM 702, and a general purpose processor 704. The PREM array 701 can be used to store programs of instructions for execution by the general purpose processor 704. In addition, instructions stored in the SRAM 702 by an external controller or transferred to the SRAM 702 from the PREM array 701, can be provided for execution by the processor to control the programming of the PREM array.

In summary, the present invention provides a novel non-volatile memory named PREM (Programmable Resistor with Erase-less Memory) where the property of the inter-electrode layer that changes in response to stress is resistance. One embodiment of a PREM cell is composed by a $p^+$-polysilicon gate, ultra-thin oxide and $n^+$ diffusion, and utilizes the progressive breakdown in ultra-thin oxide as a data storage feature. The PREM device can achieve full CMOS-process compatibility, MTP (multi-time programming), MLC (multi-level cell) and low voltage operation (within ±2V). Logic circuits, SRAM and non-volatile PREM can be integrated easily for SOC applications. The cell data retention performance is excellent. There is no detected program disturbance phenomenon. There is no detected read disturbance phenomenon.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

What is claimed is:

1. A method for manufacturing an integrated circuit including memory cells on a substrate, where data is stored by setting a property of a selected memory cell above or below a reference level to store a data value, comprising:

forming a first plurality of conductive lines on said substrate, said first plurality of conductive lines extending generally in parallel in a first direction;

forming a second plurality of conductive lines over said first plurality of conductive lines, said second plurality of conductive lines extending generally in parallel in a second direction orthogonal to the first direction defining an array of intersections;

forming an inter-electrode layer of material at said intersections between said first plurality of conductive lines and said second plurality of conductive lines, said inter-electrode layer of material characterized by progressive change in a property in response to stress, to form memory cells at said intersections; and providing circuitry on said substrate for applying said stress to set said property above or below said reference level to indicate data values in the memory cells, and to reset said memory cells by changing said reference level.

2. The method of claim 1, wherein said inter-electrode layer of material comprises silicon dioxide having a thickness less than 20 Angstroms.

3. The method of claim 1, wherein said inter-electrode layer of material comprises silicon oxynitride having a thickness less than 20 Angstroms.

4. The method of claim 1, wherein forming said inter-electrode layer of material comprises applying thermal oxidation to form silicon dioxide.

5. The method of claim 1, wherein forming said inter-electrode layer of material comprises applying atomic layer deposition.

6. The method of claim 1, wherein forming said inter-electrode layer of material comprises applying pulsed vapor deposition.

7. The method of claim 1, wherein forming said inter-electrode layer of material comprises applying jet vapor deposition.

8. The method of claim 1, wherein forming said inter-electrode layer of material comprises applying sputtering.

9. The method of claim 1, wherein forming said inter-electrode layer of material comprises applying chemical vapor deposition.

10. The method of claim 1, wherein forming said inter-electrode layer of material comprises applying thermal oxidation to form silicon dioxide, and exposing said silicon dioxide to a nitrogen source during or after said thermal oxidation.

11. The method of claim 1, wherein said inter-electrode layer of material comprises silicon dioxide having a thickness less than 15 Angstroms.

12. The method of claim 1, wherein said inter-electrode layer of material comprises silicon oxynitride having a thickness less than 15 Angstroms.

13. The method of claim 1, including forming a plurality of isolation structures on said substrate between conductive lines in the first plurality of conductive lines.

14. The method of claim 1, including forming a plurality of trenches in the substrate between conductive lines in the first plurality of conductive lines, and filling said trenches with dielectric.

15. The method of claim 1, including forming a plurality of trenches filled with dielectric in the substrate extending generally in parallel in the first direction, and wherein said forming the first plurality of conductive lines includes doping the substrate between said trenches to form conductive diffusion regions.

16. The method of claim 1, wherein the circuitry to apply said stress includes circuits to apply program current through the memory cells, for a time interval sufficient to cause progressive breakdown of the dielectric layer.

17. The method of claim 1, wherein the circuitry to apply said stress includes circuits to apply a program voltage across selected lines in said first and second pluralities of conductive lines for a time interval, wherein said program voltage is less than five volts.

18. The method of claim 1 wherein the circuitry to apply said stress includes circuits to apply a positive program voltage to a first selected line in the second plurality of conductive lines and a negative program voltage to a second selected line in the first plurality of conductive lines for a time interval, wherein said positive and negative program voltages have respective absolute values less than two volts.

19. The method of claim 1, wherein the substrate comprises a semiconductor substrate, and forming said first plurality of conductive lines comprises patterning and doping conductive diffusion regions in the semiconductor substrate, and forming said second plurality of conductive lines comprises patterning and depositing polysilicon strips.

20. The method of claim 1, wherein the substrate comprises a semiconductor substrate, and forming said first plurality of conductive lines comprises patterning and doping conductive diffusion regions having a first conductivity type in the semiconductor substrate, and forming said second plurality of conductive lines comprises patterning and depositing doped polysilicon strips having a second conductivity type.

21. The method of claim 1, wherein the substrate comprises a semiconductor substrate, and forming said first plurality of conductive lines comprises patterning and doping p-type conductive diffusion regions in the semiconductor substrate, and forming said second plurality of conductive lines comprises patterning and depositing n-type polysilicon strips.

22. The method of claim 1, wherein the substrate comprises a semiconductor substrate, and forming said first plurality of conductive lines comprises patterning and doping conductive diffusion regions in the semiconductor substrate, and forming said second plurality of conductive lines comprises patterning and depositing metal strips.

23. The method of claim 1, wherein forming said first plurality of conductive lines comprises patterning and depositing metal strips, and forming said second plurality of conductive lines comprises patterning and depositing metal strips.

24. The method of claim 1, wherein the circuitry to sense said property includes circuits to apply a read voltage across selected ones of the first and second pluralities of conductive lines accessing selected memory cells in the array, and to sense the amount of progressive breakdown.

25. The method of claim 1 wherein the circuitry to sense said property includes circuits to apply a read voltage of less than 2 volts across selected ones of the first and second pluralities of conductive lines accessing selected memory cells in the array, and to sense the amount of progressive breakdown.

26. The method of claim 1, wherein forming one of said first plurality of conductive lines and said second plurality of conductive lines comprises patterning and depositing at least one of semi-metal and metal silicide.

27. The method of claim 1, wherein said material in said inter-electrode layer of material comprises at least one of $Al_2O_3$, $YTa_2O_5$, $HfO_2$, $Y_2O_3$, $CeO_2$, $TiO_2$, $HfSi_xO_y$, HfSiON, $HfAlO_x$, $TaO_xN_y$, $ZrO_2$, $ZrSi_xO_y$, $La_2O_3$, and $ZrO_2$.

28. A method for forming memory cell on a semiconductor substrate, comprising:
  implanting dopant in said semiconductor substrate to form a conductive diffusion region having a first conductivity type;
  forming an inter-electrode layer of material on the conductive diffusion region, the inter-electrode layer of material characterized by progressive change in resistance in response to stress induced by voltage across the layer of less than five volts; and
  forming a layer of doped semiconductor having a second conductivity type over said inter-electrode layer of material; and providing circuitry for programming data values stored in said memory cell multiple times, by executing a procedure including
  setting a property of said memory cell above or below a first reference level;
  resetting said memory cell by changing the reference level to a second reference level; and
  setting the property of said memory cell above or below the second reference level to indicate said data values in said memory cell.

29. A method for forming memory cell on a silicon substrate, comprising:
  implanting dopant in said silicon substrate to form a conductive diffusion region having a first conductivity type;
  forming a layer of silicon oxide on the conductive diffusion region, the layer of silicon oxide having thickness of less than 15 Angstroms; and
  forming a layer of doped polysilicon having a second conductivity type over said layer of silicon oxide; and providing circuitry for programming multiple bits of data in memory cells in a memory array multiple times, by executing a procedure including
  setting a property of memory cells in the array above or below a first set of reference levels to indicate multiple bits of data in said memory cells;
  resetting the array by changing the first set of reference levels to a second set of reference levels; and
  setting the property of memory cells in the array above or below the second set of reference levels to indicate said multiple bits of data in said memory cells.

30. The method of claim 29, wherein forming the layer of silicon oxide includes thermally growing silicon dioxide and exposing said silicon dioxide to a source of nitrogen during or after said thermally growing.

31. A method for manufacturing a memory cell, where data is stored by setting a property of the memory cell above or below a reference level to store a data value, comprising:
  forming a first electrode;
  forming an inter-electrode layer of material on the first electrode, the inter-electrode layer of material having a property characterized by progressive change in response to stress; and
  forming a second electrode over the inter-electrode layer of material on the first electrode, wherein said stress comprises voltage less than 5 volts across the first and second electrodes; and
  providing circuitry on said substrate for applying said stress to set said property above or below said reference level to indicate data values in the memory cells, and to reset said memory cells by changing said reference level.

* * * * *